United States Patent
Watanabe

(10) Patent No.: US 9,559,050 B2
(45) Date of Patent: Jan. 31, 2017

(54) SEMICONDUCTOR DEVICE AND MANUFACTURING METHOD THEREOF

(71) Applicant: RENESAS ELECTRONICS CORPORATION, Toyko (JP)

(72) Inventor: Tetsuya Watanabe, Tokyo (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/019,644

(22) Filed: Feb. 9, 2016

(65) Prior Publication Data

US 2016/0163638 A1   Jun. 9, 2016

Related U.S. Application Data

(62) Division of application No. 14/448,954, filed on Jul. 31, 2014, now Pat. No. 9,281,272.

(30) Foreign Application Priority Data

Sep. 24, 2013  (JP) ................................ 2013-197551

(51) Int. Cl.
  *H01L 23/522*    (2006.01)
  *H01L 49/02*    (2006.01)
  *H01L 21/3213*    (2006.01)

(52) U.S. Cl.
  CPC ..... *H01L 23/5223* (2013.01); *H01L 21/32139* (2013.01); *H01L 28/60* (2013.01); *H01L 28/88* (2013.01); *H01L 2924/0002* (2013.01)

(58) Field of Classification Search
  CPC .... H01L 23/5223; H01L 23/522; H01L 28/40; H01L 28/88; H01L 28/60; H01L 21/32139
  (Continued)

(56) References Cited

U.S. PATENT DOCUMENTS 8,397,182 B2    3/2013  Nagahara
8,558,346 B1    10/2013  Cheng et al.
(Continued)

FOREIGN PATENT DOCUMENTS

JP    2009-294308 A    12/2009
JP    2012-74755 A    4/2012

OTHER PUBLICATIONS

U.S. Notice of Allowance dated Nov. 3, 2015 in co-pending U.S. Appl. No. 14/448,954.
(Continued)

*Primary Examiner* — Nathan W Ha
(74) *Attorney, Agent, or Firm* — McGinn IP Law Group, PLLC.

(57) ABSTRACT

A method for manufacturing a semiconductor device includes forming a first conductor pattern and a second conductor pattern running side by side with each other, including forming a first portion of the first conductor pattern and a second portion of the second conductor pattern by patterning using a first mask, and forming a second portion of the first conductor pattern and a first portion of the second conductor pattern by patterning using a second mask. A first inter-conductor capacity is formed by the first portion of the first conductor pattern and the first portion of the second conductor pattern. A second inter-conductor capacity is formed by the second portion of the first conductor pattern and the second portion of the second conductor pattern.

12 Claims, 16 Drawing Sheets

(58) Field of Classification Search
USPC .......................................................... 257/532
See application file for complete search history.

(56) References Cited

U.S. PATENT DOCUMENTS

| | | | |
|---|---|---|---|
| 2003/0057558 A1* | 3/2003 | Akiyama | .......... H01L 21/76802 |
| | | | 257/758 |
| 2004/0124454 A1* | 7/2004 | Choi | ................. H01L 27/11502 |
| | | | 257/295 |
| 2005/0135042 A1 | 6/2005 | Chiu-Kit Fong et al. | |
| 2006/0019460 A1* | 1/2006 | Phan | ................... H01L 27/0629 |
| | | | 438/393 |
| 2006/0170024 A1* | 8/2006 | Yang | ....................... H01L 28/60 |
| | | | 257/301 |
| 2009/0061362 A1 | 3/2009 | Taoka et al. | |
| 2009/0090951 A1 | 4/2009 | Chang et al. | |
| 2012/0092806 A1 | 4/2012 | Hua et al. | |
| 2013/0043968 A1 | 2/2013 | Cho | |
| 2014/0001597 A1 | 1/2014 | Huang et al. | |
| 2014/0008111 A1 | 1/2014 | Kuo et al. | |

OTHER PUBLICATIONS

U.S. Office Action dated May 26, 2015 in co-pending U.S. Appl. No. 14/448,954.
Japanese Office Action dated Nov. 29, 2016 with an English translation.

* cited by examiner

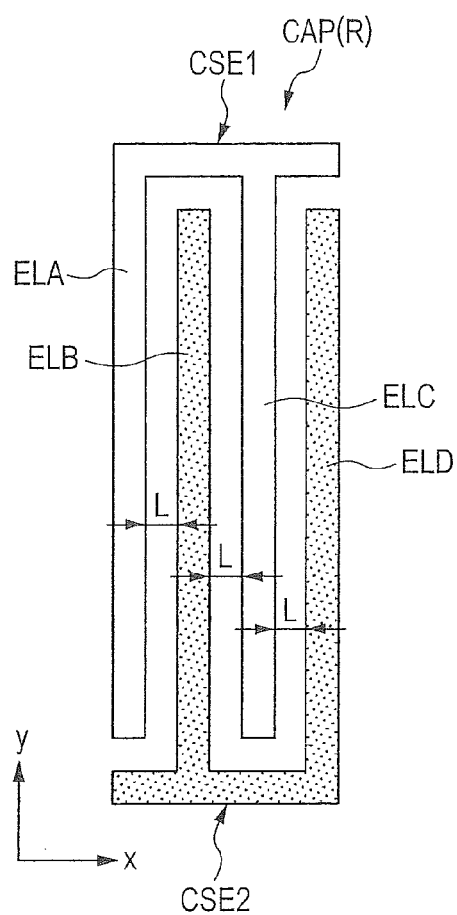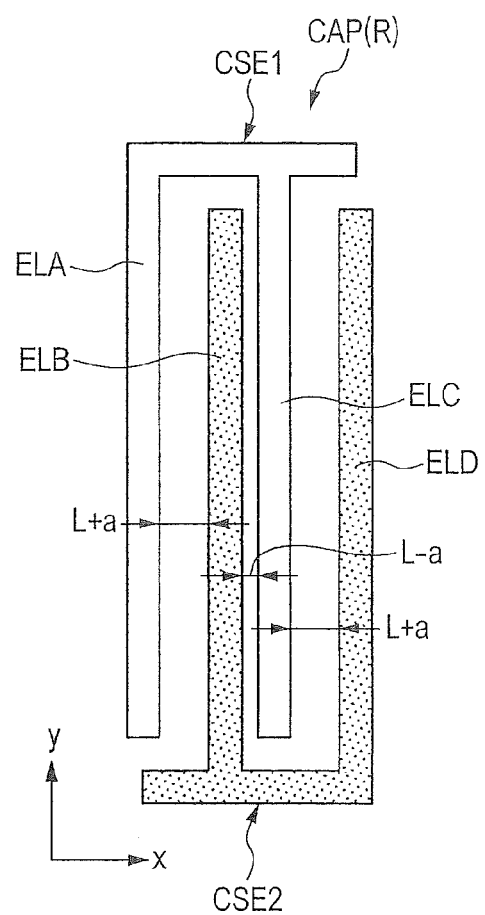

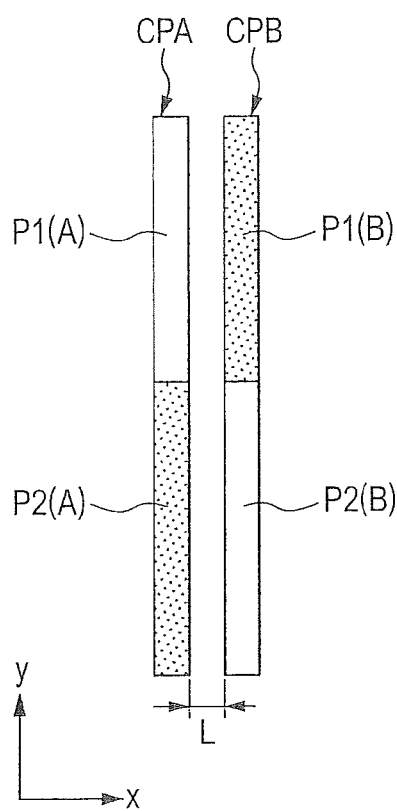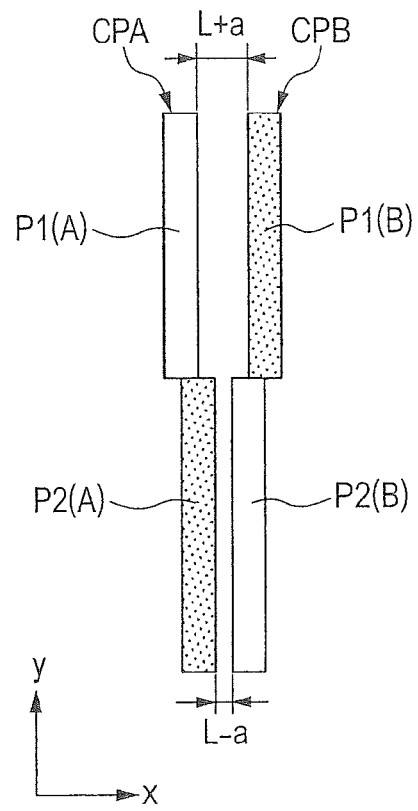

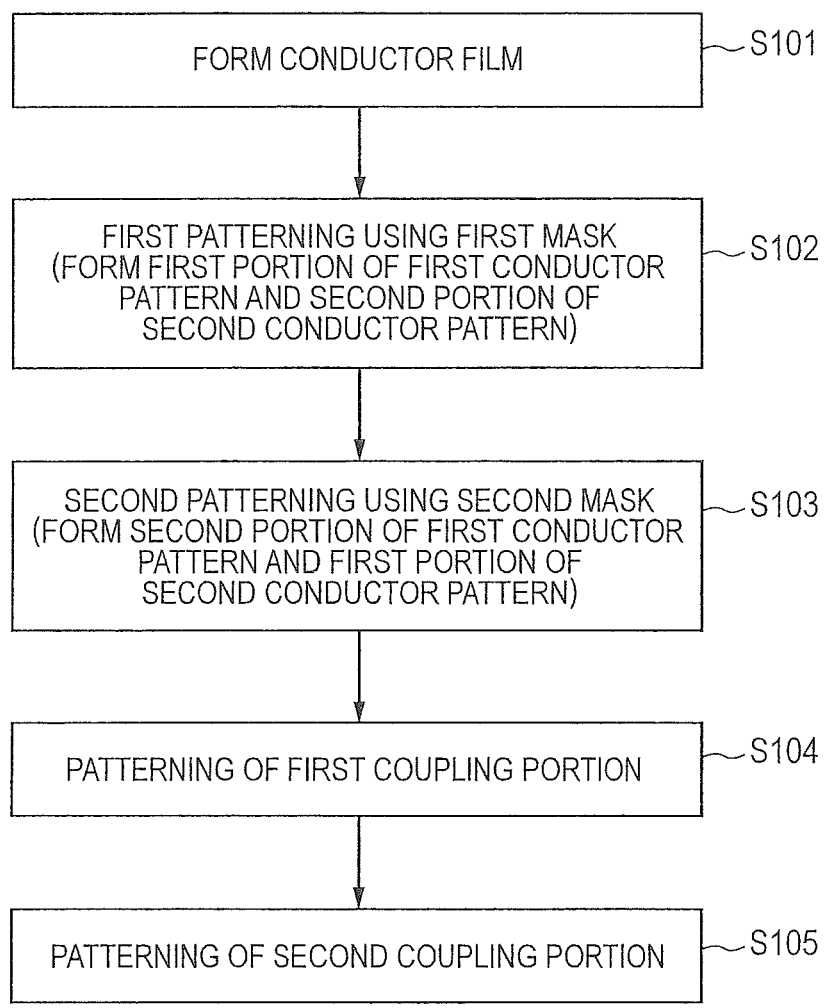

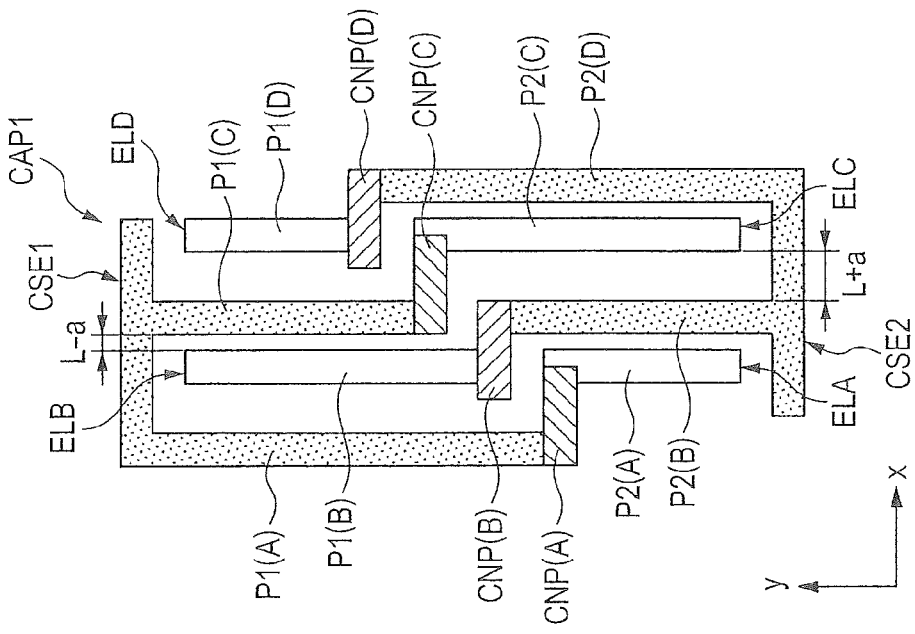
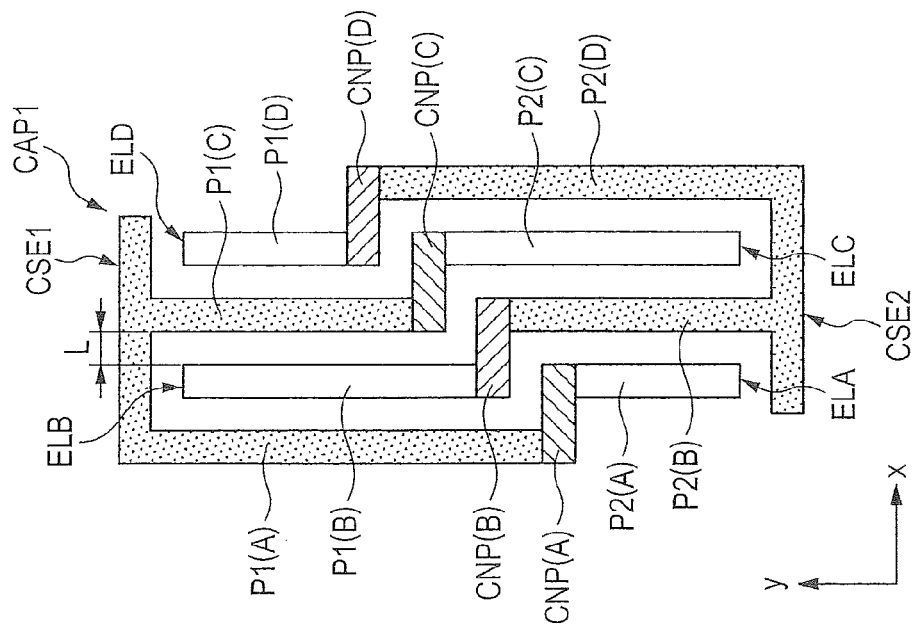

SEMICONDUCTOR DEVICE AND MANUFACTURING METHOD THEREOF

The present application is a Divisional application of U.S. patent application Ser. No. 14/448,954, filed on Jul. 31, 2014, which is based on and claims priority from Japanese Patent Application No. 2013-197551, filed on Sep. 24, 2013, the entire contents of which are incorporated herein by reference.

BACKGROUND

The present invention relates to a semiconductor device and a manufacturing technology thereof, and relates to, for example, a technology effective when applied to a semiconductor device using a microfabrication technology and a manufacturing technology thereof.

A technology related to a so-called double patterning method has been described in Japanese Unexamined Patent Publication No. 2009-294308 (Patent Document 1) and Japanese Unexamined Patent Publication No. 2012-74755 (Patent Document 2) as a technology that realizes microfabrication exceeding a resolution limit of a photolithography technique.

SUMMARY

In recent years, microminiaturization of a semiconductor element and wirings formed in a semiconductor chip has been advanced from the viewpoint of pushing ahead with miniaturization of a semiconductor device. In particular, the microminiaturization of the semiconductor element and the wirings has reached a level exceeding the performance limit of the current microfabrication technology (patterning technology). Therefore, a technology referred to as a so-called double patterning method has been adopted even in the current microfabrication technology to cope with further microminiaturization.

This double patterning method is a method for forming patterns adjacent to each other by separate masks to thereby relax a microminiaturization level of each of the patterns formed by the individual masks. Thus, the use of the double patterning method enables coping with the microminiaturization exceeding the performance limit even in the current microfabrication technology.

Since, however, the patterns adjacent to each other are formed by the different masks in the double patterning method, there is a risk that, for example, a working shape and interval are shifted from the design values between wirings adjacent to each other due to a positional displacement between the masks. Such shifting of the working shape and interval from the design values contributes even to a variation in the characteristics of the semiconductor device. That is, the above-described double patterning method has the advantage of being capable of coping with the microminiaturization exceeding the performance limit of the current microfabrication technology, but on the other hand, has room for improvement in that the variation in the characteristics of the semiconductor device due to the mask misalignment is likely to occur.

Other objects and novel features of the present invention will become apparent from the description of the present specification and the accompanying drawings.

A semiconductor device manufacturing method according to one embodiment has the steps of forming a first portion of a first conductor pattern and a second portion of a second conductor pattern by patterning using a first mask, and forming a second portion of the first conductor pattern and a first portion of the second conductor pattern by patterning using a second mask. At this time, a first inter-conductor capacity is formed by the first portion of the first conductor pattern and the first portion of the second conductor pattern, and a second inter-conductor capacity is formed by the second portion of the first conductor pattern and the second portion of the second conductor pattern.

Also, in a semiconductor device manufacturing method according to one embodiment, when a positional displacement occurs between a first mask and a second mask, each of a first conductor pattern and a second conductor pattern is divided into a portion formed by first patterning and a portion formed by second patterning in such a manner that a portion where the distance between the first conductor pattern and the second conductor pattern becomes smaller than when the positional displacement does not occur between the first and second masks and a portion where the distance becomes larger than when the positional displacement does not occur between the first and second masks exist.

Further, a semiconductor device according to one embodiment includes a first conductor pattern and a second conductor pattern running side by side with each other. Here, each of the first conductor pattern and the second conductor pattern has a first portion extending in a first direction, a second portion that extends in the first direction and is arranged deviated from the first portion in a second direction orthogonal to the first direction, and a coupling portion that couples the first portion and the second portion and extends in the second direction. The first portion of the first conductor pattern and the second portion of the second conductor pattern are arranged over a straight line.

According to one embodiment, it is possible to suppress a variation in the characteristics of a semiconductor device.

BRIEF DESCRIPTION OF THE DRAWINGS

FIG. 1A is a diagram showing a typical configuration of a capacitive element in a related art, and FIG. 1B is a diagram showing an example of a state in which a positional displacement exists between masks;

FIGS. 2A and 2B are respectively diagrams for describing a basic concept of a first embodiment;

FIG. 4 is a flowchart showing the flow for manufacturing the conductor patterns in the first embodiment;

FIG. 5A is a diagram showing a planar configuration of a capacitive element in the first embodiment, and FIG. 5B is a diagram showing an example of a state in which a positional displacement exists between masks;

DETAILED DESCRIPTION

Figure 3A:
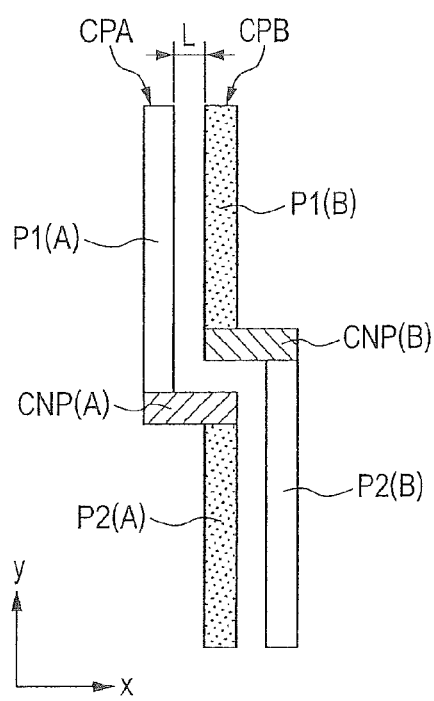
FIGS. 3A and 3B are respectively diagrams for describing points devised to suppress degradation in reliability of coupling of first and second portions of conductor patterns.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be the specific number or more or less unless otherwise specified in particular and definitely limited to the specific number in principle.

It is further needless to say that components (including element steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan diagrams may be hatched for clarity of illustration.

First Embodiment

<Description of Related Art>

FIG. 1A is a diagram showing a typical configuration of a capacitive element CAP (R) in the related art. As shown in FIG. 1A, the capacitive element CAP (R) in the related art is comprised of a comb-type electrode CSE1 and a comb-type electrode CSE2. The comb-type electrode CSE1 has a structure in which an electrode ELA and an electrode ELC extending in a y direction are integrally coupled in an x direction. The comb-type electrode CSE2 also has a structure in which an electrode ELB and an electrode ELD extending in the y direction are integrally coupled in the x direction. Further, the comb-type electrodes CSE1 and CSE2 are arranged in such a manner than the electrodes ELA through ELD run side by side alternately.

Here, for example, as microminiaturization to narrow intervals between the electrodes ELA through ELD progresses in corresponding with to miniaturization of the capacitive element CAP (R), it is anticipated that a microfabrication technology for forming the electrodes ELA through ELD by a single mask is not able to cope with it. Therefore, even in the current microfabrication technology, there is known, for example, a technology called a so-called double patterning method to cope with further microminiaturization.

The double patterning method is a method for forming mutually adjoining patterns by separate masks to thereby relax the level of microminiaturization of the patterns formed by the individual masks. Thus, the use of the double patterning method makes it possible to cope with microminiaturization exceeding a performance limit even in the current microfabrication technology.

Specifically, the double patterning method is that in FIG. 1A, for example, the electrodes ELA and ELC that configure the comb-type electrode CSE1 are formed by first patterning using a first mask, and the electrodes ELB and ELD that configure the comb-type electrode CSE2 are formed by second patterning using a second mask. In FIG. 1A, the comb-type electrode CSE1 formed by the first patterning is shown as a void area, whereas the comb-type electrode CSE2 formed by the second patterning is shown as a dot area.

Here, FIG. 1A shows the case where in the double patterning method, the electrodes ELA through ELD are formed in a state in which no positional displacement occurs between the first mask used in the first patterning and the second mask used in the second patterning. In this case, the interval between the electrodes ELA and ELB, the interval between the electrodes ELB and ELC, and the interval between the electrodes ELC and ELD are all equal to each other and taken as "L", for example. Accordingly, the capacity between the electrodes ELA and ELB, the capacity between the electrodes ELB and ELC, and the capacity between the electrodes ELC and ELD are all equal to each other. For example, the capacitance values thereof are taken to be "C". At this time, the capacitance value of the capacitive element CAP (R) in the related art becomes "3C" (design value) because the three inter-electrode capacities described above are coupled in parallel.

<Room for Improvement Existing in the Related Art>

It is however considered that since the adjacent patterns are formed by the separate masks in the double patterning method, for example, the distance between the adjacent electrodes is deviated from the design value "L" due to the positional displacement between the masks. Specifically, FIG. 1B is a diagram showing the case where the electrodes ELA through ELD are formed in a state in which the second mask used in the second patterning is positionally displaced by "a" in the x direction with respect to the first mask used in the first patterning. In FIG. 1B, as a result of the positional displacement of the second mask by "a" in the x direction with respect to the first mask, the distance between the electrodes ELA and ELB becomes "L+a", the distance between the electrodes ELB and ELC becomes "L−a", and the distance between the electrodes ELC and ELD becomes "L+a".

Thus, the capacity of the capacitive element CAP (R) in the state in which the positional displacement exists between the masks is represented like an equation (1) shown below:

$$1 \cdot C \cdot L/(L-a) + 2 \cdot C \cdot L/(L+a) = \qquad (1)$$
$$\{C \cdot L \cdot (L+a) + 2 \cdot C \cdot L \cdot (L-a)\}/\{(L+a)(L-a)\} =$$
$$(3 \cdot C \cdot L \cdot L - C \cdot L \cdot a)/\{(L+a)(L-a)\}$$

Accordingly, the difference that occurs between the case where the positional displacement exists between the masks and the case where no positional displacement exists therebetween is represented like an equation (2):

$$\text{Difference} = 3 \cdot C - (3 \cdot C \cdot L \cdot L - C \cdot L \cdot a)/\{L+a\}(L-a)\} \qquad (2)$$
$$= (C \cdot L \cdot a - 3 \cdot C \cdot a \cdot a)/\{(L+a)(L-a)\}$$

From the above, when the positional displacement exists between the masks in the double patterning method, the capacitance value of the capacitive element CAP (R) in the related art is varied by the difference expressed in the equation (2) from "3C" (design value). Since such a deviation in the capacitance value becomes even a factor of varying the characteristics of a semiconductor device, there is a need to reduce the deviation in the capacitance value as much as possible from the viewpoint of sufficiently suppressing the variation in the characteristics of the semiconductor device.

Thus, while the double patterning method is capable of coping with the microminiaturization exceeding the performance limit of the microfabrication technology using the single mask, there is room for improvement in that the variation in the characteristics of the semiconductor device due to the positional displacement between the masks is easy to occur.

Therefore, the present embodiment has applied the contrivance for suppressing the striking variation in the characteristics of the semiconductor device by using the double patterning method. A description will be made below about the technical concept in the present embodiment to which the contrivance has been applied.

<Basic Concept of First Embodiment>

FIGS. 2A and 2B are respectively diagrams for describing the basic concept of the first embodiment. In FIG. 2A, a conductor pattern CPA and a conductor pattern CPB extend in a y direction while running side by side with each other. That is, the conductor pattern CPA and the conductor pattern CPB extend in the y direction while keeping the distance between the conductor pattern CPA and the conductor pattern CPB at "L". At this time, the conductor pattern CPA has a first portion P1 (A) and a second portion P2 (A), and the conductor pattern CPB has a first portion P1 (B) and a second portion P2 (B). Further, the first portion P1 (A) of the conductor pattern CPA and the first portion P1 (B) of the conductor pattern CPB are arranged in opposing positions to one another. As a result, a capacity is formed by the first portion P1 (A) of the conductor pattern CPA and the first portion P1 (B) of the conductor pattern CPB. On the other hand, the second portion P2 (A) of the conductor pattern CPA and the second portion P2 (B) of the conductor pattern CPB are arranged in opposing positions to one another. As a result, a capacity is formed by the second portion P2 (A) of the conductor pattern CPA and the second portion P2 (B) of the conductor pattern CPB.

Here, the conductor patterns CPA and CPB running side by side with each other are formed by patterning using a photography technology, for example. In the present embodiment in particular, the first portion P1 (A) of the conductor pattern CPA and the second portion P2 (B) of the conductor pattern CPB are formed by first patterning using a first mask, whereas the second portion P2 (A) of the conductor pattern CPA and the first portion P1 (B) of the conductor pattern CPB are formed by second patterning using a second mask. In FIG. 2A, for example, the first portion P1 (A) of the conductor pattern CPA and the second portion P2 (B) of the conductor pattern CPB both formed by the first patterning are shown as void areas, whereas the second portion P2 (A) of the conductor pattern CPA and the first portion P1 (B) of the conductor pattern CPB both formed by the second patterning are shown as dot areas. Further, FIG. 2A shows the case where in the double patterning method, the conductor pattern CPA and the conductor pattern CPB are formed in a state in which no positional displacement occurs between the first mask used in the first patterning and the second mask used in the second patterning. In this case, the distance between the conductor pattern CPA and the conductor pattern CPB becomes "L", for example.

In the double patterning method, however, for example, the distance between adjacent electrodes is considered to be deviated from the design value "L" depending on the mask's positional displacement because the adjacent patterns are formed by the separate masks. Specifically, FIG. 2B is a diagram showing the case where the conductor pattern CPA and the conductor pattern CPB are formed in a state in which the second mask used in the second patterning is positionally displaced by "a" in an x direction with respect to the first mask used in the first patterning. As shown in FIG. 2B, as a result of the positional displacement of the second mask by "a" in the x direction with respect to the first mask, the distance between the first portion P1 (A) of the conductor pattern CPA and the first portion P1 (B) of the conductor pattern CPB becomes "L+a", and the distance between the second portion P2 (A) of the conductor pattern CPA and the second portion P2 (B) of the conductor pattern CPB becomes "L−a". The basic concept of the present embodiment resides in this point.

That is, the basic concept of the present embodiment is characterized by points shown below. For example, as shown in FIG. 2A, in the conductor patterns CPA and CPB arranged to run side by side with each other, the conductor pattern CPA is divided into the first portion P1 (A) and the second portion P2 (A), and the conductor pattern CPB is also divided into the first portion P1 (B) and the second portion P2 (B). Further, the first portion P1 (A) of the conductor pattern CPA and the second portion P2 (B) of the conductor pattern PCB are formed by the first patterning using the same first mask, while the second portion P2 (A) of the conductor pattern CPA and the first portion P1 (B) of the conductor pattern CPB are formed by the second patterning using the same second mask. That is, as shown in FIG. 2A, the first portion P1 (A) of the conductor pattern CPA and the first portion P1 (B) of the conductor pattern CPB both facing each other are formed by patterning using the masks different from each other. Further, the second portion P2 (A) of the conductor pattern CPA and the second portion P2 (B) of the conductor pattern CPB both facing each other are formed by patterning using the masks different from each other.

At this time, as shown in FIG. 2A, when attention is paid to the first portion P1 (A) of the conductor pattern CPA and the first portion P1 (B) of the conductor pattern CPB, the first portion P1 (A) of th conductor pattern CPA formed by the first patterning using the first mask is relatively arranged on the left side, and the first portion P1 (B) of the conductor pattern CPB formed by the second patterning using the second mask is relatively arranged on the right side. On the other hand, as shown in FIG. 2A, when attention is paid to the second portion P2 (A) of the conductor pattern CPA and the second portion P2 (B) of the conductor pattern CPB, the second portion P2 (B) of the conductor pattern CPB formed by the first patterning using the first mask is relatively arranged on the right side, and the second portion P2 (A) of the conductor pattern CPA formed by the second patterning using the second mask is relatively arranged on the left side.

Thus, as shown in FIG. 2A, the positional relation of the first patterning and second patterning with respect to the first portion P1 (A) of the conductor pattern CPA and the first portion P1 (B) of the conductor pattern CPB, and the positional relation of the first patterning and second patterning with respect to the second portion P2 (A) of the conductor pattern CPA and the second portion P2 (B) of the conductor pattern CPB are reversely arranged.

According to such a basic concept of the present embodiment, it is possible to suppress the variation in the value of the capacity formed between the conductor patterns CPA and CPB even when the positional displacement occurs between the first mask used in the first patterning and the second mask used in the second patterning. This point will be described specifically below. Assume that as shown in FIG. 2B, for example, the position of the second mask used in the second patterning is displaced by "a" in the x direction (right side) with respect to the position of the first mask used in the first patterning.

In this case, as shown in FIG. 2B, the first portion P1 (B) of the conductor pattern CPB arranged on the right side is further shifted to the right side in the relation between the first portion P1 (A) of the conductor pattern CPA and the first portion P1 (B) of the conductor pattern CPB. Thus, the distance between the first portion P1 (A) of the conductor pattern CPA and the first portion P1 (B) of the conductor pattern CPB both facing each other extends to "L+a". As a result, in the relation between the first portion P1 (A) of the conductor pattern CPA and the first portion P1 (B) of the conductor pattern CPB, a change in the capacity due to the positional displacement between the masks becomes a change in the direction in which the capacity is reduced.

On the other hand, as shown in FIG. 2B, the second portion P2 (A) of the conductor pattern CPA arranged on the left side is shifted to the right side in the relation between the second portion P2 (A) of the conductor pattern CPA and the second portion P2 (B) of the conductor pattern CPB. Thus, the distance between the second portion P2 (A) of the conductor pattern CPA and the second portion P2 (B) of the conductor pattern CPB both facing each other is narrowed to "L−a". As a result, in the relation between the second portion P2 (A) of the conductor pattern CPA and the second portion P2 (B) of the conductor pattern CPB, a change in the capacity due to the positional displacement between the masks becomes a change in the direction in which the capacity becomes larger.

Thus, when the entire capacity related to the conductor pattern CPA and the conductor pattern CPB is considered, a change in the entire capacity due to the positional displacement between the masks is canceled and reduced by a decrease in the capacity between the first portion P1 (A) of the conductor pattern CPA and the first portion P1 (B) of the conductor pattern CPB and an increase in the capacity between the second portion P2 (A) of the conductor pattern CPA and the second portion P2 (B) of the conductor pattern CPB. As a result, according to the basic concept of the present embodiment, the variation in the capacity between the conductor pattern CPA and the conductor pattern CPB due to the positional displacement between the masks can be reduced, thereby making it possible to suppress the variation in the characteristics of the semiconductor device.

Thus, the basic concept of the present embodiment is premised on the formation of the conductor patterns CPA and CPB by the combination of the first patterning using the first mask and the second pattering using the second mask. Further, the present basic concept is a concept that the conductor pattern CPA and the conductor pattern CPB are respectively divided into the portions formed by the first patterning and the portions formed by the second patterning in such a manner that the portion where the distance becomes smaller than the case where no positional displacement occurs between the masks, and the portion where the distance becomes larger than the case where no positional displacement occurs between the masks exist.

In other words, the present basic concept can also be taken as a concept that when the positional displacement occurs between the masks, the conductor pattern CPA and the conductor pattern CPB are respectively divided into the portions formed by the first patterning and the portions formed by the second patterning in such a manner that the portion where the capacity becomes smaller than the case where no positional displacement occurs between the masks and the portion where the capacity becomes larger than the case where no positional displacement occurs between the masks exist.

For example, the capacity formed by the first portion P1 (A) of the conductor pattern CPA and the first portion P1 (B) of the conductor pattern CPB is defined as a first inter-conductor capacity. The capacity formed by the second portion P2 (A) of the conductor pattern CPA and the second portion P2 (B) of the conductor pattern CPB is defined as a second inter-conductor capacity. In this case, the basic concept of the present embodiment can take an embodied form that when the positional displacement occurs between the masks, the first inter-conductor capacity becomes larger than the case where no positional displacement occurs between the masks, while the second inter-conductor capacity becomes smaller than the case where no positional displacement occurs between the masks. Alternatively, the basic concept can also take another embodied form that when the positional displacement occurs between the masks, the first inter-conductor capacity becomes smaller than the case where no positional displacement occurs between the masks, while the second inter-conductor capacity becomes larger than the case where no positional displacement occurs between the masks.

Here, the change in the entire capacity related to the conductor pattern CPA and the conductor pattern CPB where the positional displacement occurs between the masks is represented by addition of the above increase in the first inter-conductor capacity and the above decrease in the second inter-conductor capacity or addition of the above decrease in the first inter-conductor capacity and the above increase in the second inter-conductor capacity. Therefore, from the viewpoint of reducing the change in the entire capacity, the change in the first inter-conductor capacity and the change in the second inter-conductor capacity are preferably as equal as possible. This is because since the capacity change is completely canceled if the change in the first inter-conductor capacity and the change in the second inter-conductor capacity are equal, the variation in the entire capacity can be reduced to a value that becomes small without limit. From this point of view, it is desirable that, for example, the area of the first portion P1 (A) of the conductor pattern CPA and the area of the second portion P2 (A) of the conductor pattern CPA are equal, and the area of the first portion P1 (B) of the conductor pattern CPB and the area of the second portion P2 (B) of the conductor pattern CPB are equal.

This is the basic concept of the present embodiment, but further contrivance is made upon embodying the basic concept in the present embodiment. This point will be described below.

When the second portion P2 (A) of the conductor pattern CPA is formed deviated from the first portion P1 (A) of the conductor pattern CPA in FIG. 2B, for example, there is a possibility that the portion to couple the first portion P1 (A) and the second portion P2 (A) will be narrow, and the reliability of coupling between the first portion P1 (A) and the second portion P2 (A) will be degraded. In extreme cases, there is also a possibility that the first portion P1 (A) and the second portion P2 (A) will be disconnected.

That is, the above-described basic concept is characterized in that, for example, the conductor pattern CPA is divided into the first portion P1 (A) and the second portion P2 (A), and the first portion P1 (A) and the second portion P2 (A) are formed by patterning using the different masks. This is because when, however, consideration is taken that the basic concept is actually embodied, it is necessary to consider the degradation of the reliability of coupling between the first portion P1 (A) and the second portion P2 (A) due to the positional displacement between the masks.

Thus, in the present embodiment, when the basic concept is embodied, a contrivance is made to suppress the degradation of the reliability of coupling between the first portion P1 (A) of the conductor pattern CPA and the second portion P2 (A) of the conductor pattern CPA even when the positional displacement between the masks occurs.

Figure 3B:
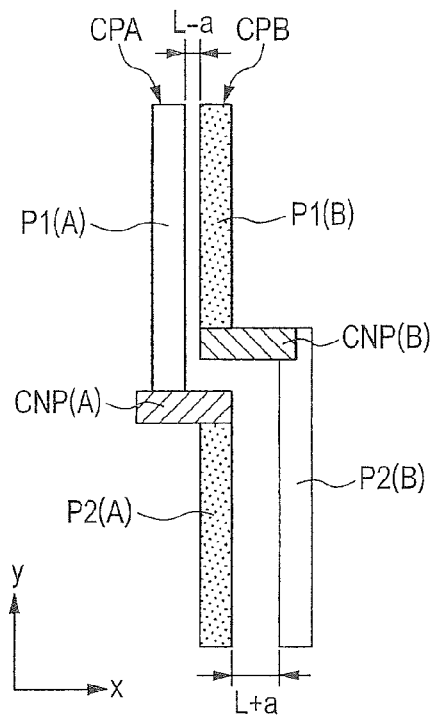

FIGS. 3A and 3B are respectively diagrams for describing such a point of contrivance. In FIG. 3A, a conductor pattern CPA has a first portion P1 (A) and a second portion P2 (A) and further has a coupling portion CNP (A) that couples the first portion P1 (A) and the second portion P2 (A). At this time, the first portion P1 (A) of the conductor pattern CPA is arranged to extend in a y direction. Further, the second portion P2 (A) of the conductor pattern CPA extends in the y direction and is arranged deviated from the first portion P1 (A) in an x direction orthogonal to the y direction. The coupling portion CNP (A) is arranged to extend in the x direction while coupling the first portion P1 (A) and the second portion P2 (A).

Likewise, in FIG. 3B, a conductor pattern CPB has a first portion P1 (B) and a second portion P2 (B) and further has a coupling portion CNP (B) that couples the first portion P1 (B) and the second portion P2 (B). At this time, the first portion P1 (B) of the conductor pattern CPB is arranged to extend in the y direction. Further, the second portion P2 (B) of the conductor pattern CPB extends in the y direction and is arranged deviated from the first portion P1 (B) in the x direction orthogonal to the y direction. The coupling portion CNP (B) is arranged to extend in the x direction while coupling the first portion P1 (B) and the second portion P2 (B).

Here, as shown in FIG. 3A, each of the second portion P2 (A) of the conductor pattern CPA and the first portion P1 (B) of the conductor pattern CPB is arranged over a straight line (virtual straight line). The conductor pattern CPA and the conductor pattern CPB are arranged to be nearly point symmetric with respect to the central point in the y direction on the virtual straight line. Further, the conductor pattern CPA and the conductor pattern CPB are arranged to run side by side with each other.

At this time, the term "conductor pattern CPA and conductor pattern CPB running side by side with each other" means that the conductor pattern CPA and the conductor pattern CPB extend while maintaining the distance between the conductor patterns CPA and CPB at a prescribed distance (L) irrespectively of the shapes of the conductor patterns CPA and CPB.

For example, the term "parallel to each other" is considered to mean that as shown in FIG. 2A, the conductor patterns CPA and CPB shaped linearly relative to each other normally extend in the y direction while maintaining them at the prescribed distance (L). On the other hand, the term "running side by side with each other" is used as intended for a concept also including a state in which as shown in FIG. 3A, for example, the conductor pattern CPA having no linear shape and the conductor pattern CPB having no linear shape extend while being maintained at the prescribed distance (L). That is, the "conductor patterns CAP and CPB running side by side with each other" used in the present specification serve as a concept wider than the "conductor patterns CPA and CPB parallel to each other" in that the shape of the conductor pattern CPA and the shape of the conductor pattern CPB also include the non-linear shapes.

Consider where the positional displacement occurs between the masks in the conductor patterns CPA and CPB configured so as to include the coupling portion CNP (A) and the coupling portion CNP (B) in this way. FIG. 3B is a diagram showing, for example, the case where the conductor patterns CPA and CPB are formed in a state in which the first mask used in the first patterning is positionally displaced by "a" in the x direction with respect to the second mask used in the second patterning.

When attention is first paid to the conductor pattern CPA, the first portion P1 (A) of the conductor pattern CPA and the second portion P2 (A) of the conductor pattern CPA are reliably coupled to each other by the coupling portion CNP (A) when no positional displacement occurs between the masks as shown in FIG. 3A. Further, in the present embodiment, it is found that even when the positional displacement occurs between the masks as shown in FIG. 3B, the reliability of coupling between the first portion P1 (A) of the conductor pattern CPA and the second portion P2 (A) of the conductor pattern CPA becomes reliable by the presence of the coupling portion CNP (A).

When attention is next paid to the conductor pattern CPB, the first portion P1 (B) of the conductor pattern CPB and the second portion P2 (B) of the conductor pattern CPB are reliably coupled to each other by the coupling portion CNP (B) where no positional displacement occurs between the masks as shown in FIG. 3A. Further, in the present embodiment, it is found that even when the positional displacement occurs between the masks as shown in FIG. 3B, the reliability of coupling between the first portion P1 (B) of the conductor pattern CPB and the second portion P2 (B) of the conductor pattern CPB is made sure by the presence of the coupling portion CNP (B). That is, in the case of the conductor pattern CPB as shown in FIG. 3B, the second portion P2 (B) of the conductor pattern CPB is protruded from the coupling portion CNP (B) due to the positional displacement between the masks, but is coupled to the side surface of the coupling portion CNP (B) even at the protruded portion, so that the reliability of coupling between the second portion P2 (B) of the conductor pattern CPB and the coupling portion CNP (B) is maintained.

From the above, according to the present embodiment, even when the positional displacement occurs between the masks, the reliability of coupling of the first portion P1 (A) of the conductor pattern CPA and the second portion P2 (A) thereof can be ensured by coupling the first portion P1 (A) and the second portion P2 (A) of the conductor pattern CPA to each other by the coupling portion CNP (A).

Likewise, according to the present embodiment, even when the positional displacement occurs between the masks, the reliability of coupling of the first portion P1 (B) and the second portion P2 (A) of the conductor pattern CPB can be ensured by coupling the first portion P1 (B) and the second portion P2 (B) of the conductor pattern CPB to each other by the coupling portion CNP (B).

To sum up the above, the first feature point in the present embodiment resides in that when the positional displacement occurs between the masks, the conductor pattern CPA and the conductor pattern CPB are respectively divided into the portions formed by the first patterning and the portions formed by the second patterning in such a manner that the portion where the distance becomes smaller than the case where no positional displacement occurs between the masks, and the portion where the distance becomes larger than the case where no positional displacement occurs between the masks exist. In other words, the first feature point in the present embodiment resides in that as shown in FIGS. 2A and 2B, for example, the first portion P1 (A) of the conductor pattern CPA and the second portion P2 (B) of the conductor pattern CPB are formed by the first patterning using the same first mask, while the second portion P2 (A) of the conductor pattern CPA and the first portion P1 (B) of the conductor pattern CPB are formed by the second patterning using the same second mask.

Thus, according to the present embodiment, even when the positional displacement occurs between the first mask used in the first patterning and the second mask used in the second patterning, it is possible to suppress the variation in the value of the capacity formed between the conductor patterns CPA and CPB.

Further, the second feature point in the present embodiment resides in that from the viewpoint of facilitating embodying of the above-described first feature point, as shown in FIGS. 3A and 3B, for example, the conductor pattern CPA is formed from the configuration of coupling of the first portion P1 (A) and the second portion P2 (A) by the coupling portion CNP (A), and the conductor pattern CPB is formed from the configuration of coupling of the first portion P1 (B) and the second portion P2 (B) by the coupling portion CNP (B).

Thus, according to the present embodiment, it is possible to suppress degradation of the reliability of coupling of the first portion P1 (A) and the second portion P2 (A) of the conductor pattern CPA due to the positional displacement between the masks by virtue of the above-described second feature point while holding the advantage of the above first feature point that the variation in the value of the capacity formed between the conductor pattern CPA and the conductor pattern CPB can be suppressed.

<Manufacturing Method of Conductor Patterns in the First Embodiment>

Subsequently, a description will be made about a method for manufacturing conductor patterns in the present embodiment. FIG. 4 is a flowchart showing the flow of manufacturing conductor patterns in the present embodiment. The conductor patterns referred to here are assuming, for example, capacitive elements and wirings. These components are formed over a main surface of a semiconductor substrate. At this time, the term "over the main surface of the semiconductor substrate" is used in a concept including not only the case where they are formed directly on the semiconductor substrate, but also the case where, for example, a semiconductor element typified by a field effect transistor is formed in the semiconductor substrate and after an interlayer insulating film covering the semiconductor element is formed, they are formed over the interlayer insulating film. That is, the "over the main surface of the semiconductor substrate" described in the present specification is used with the intention including not only "on the semiconductor substrate (on)", but also "over the semiconductor substrate (over)".

First, in FIG. 4, for example, a semiconductor substrate comprised of a silicon single crystal is prepared and a conductor film is formed over the main surface of the semiconductor substrate (S101). The conductor film is formed of, for example, an aluminum film, a copper film (Cu film) or a polysilicon film. Particularly, when the conductor film is the aluminium film, it is formed by using a sputtering method. When the conductor film is the copper film, it is formed by using a damascene technology. When the conductor film is the polysilicon film, it is formed by using a CVD (Chemical Vapor Deposition) method.

Next, first patterning using a first mask is applied to the formed conductor film to form a first portion of a first conductor pattern, and a second portion of a second conductor pattern (S102). Specifically, as shown in FIG. 3A, for example, the first portion P1 (A) of the conductor pattern CPA and the second portion P2 (B) of the conductor pattern CPB are formed.

Subsequently, second patterning using a second mask is applied to the formed conductor film to form a second portion of the first conductor pattern and a first portion of the second conductor pattern (S103). Specifically, as shown in FIG. 3A, for example, the second portion P2 (A) of the conductor pattern CPA and the first portion P1 (B) of the conductor pattern CPB are formed.

Thereafter, patterning of a first coupling portion that couples the first portion and the second portion of the first conductor pattern is performed on the formed conductor film (S104). Subsequently, patterning of a second coupling portion that couples the first portion and the second portion of the second conductor pattern is performed (S105). Specifically, as shown in FIG. 3A, for example, a coupling portion CNP (A) used as the first coupling portion is formed and thereafter a coupling portion CNP (B) used as the second coupling portion is formed.

The first conductor pattern and the second conductor pattern in the present embodiment can be formed in the way described above. Specifically, for example, the conductor pattern CPA and the conductor pattern CPB both shown in FIG. 3A and running side by side with each other can be manufactured.

Incidentally, although there has been described in FIG. 4, the example in which the second patterning using the second mask is performed after the execution of the first patterning using the first mask, but the invention is not limited to it. The first patterning using the first mask may be performed after the execution of the second patterning using the second mask. There has also been described in FIG. 4, the example in which the patterning of the second coupling portion is carried out after the execution of the patterning of the first coupling portion, but the patterning of the first coupling portion may be performed after the execution of the patterning of the second coupling portion. Furthermore, Steps S102 through S105 shown in FIG. 4 are not necessarily required to be carried out in this order and may be switched in arbitrary order.

<Application Example of Basic Concept of the First Embodiment to Capacitive Element>

A description will hereafter be made about an example in which the basic concept of the first embodiment is applied to a capacitive element comprised of conductor patterns.

FIG. 5A is a diagram showing a planar configuration of a capacitive element CAP1 in the present embodiment. In FIG. 5, the capacitive element CAP1 is comprised of a comb-type electrode CSE1 and a comb-type electrode CSE2. The comb-type electrode CSE1 has a structure in which an electrode ELA and an electrode ELC both extending in a y direction are integrally coupled in an x direction. The comb-type electrode CSE2 also has a structure in which an electrode ELB and an electrode ELD both extending in the y direction are integrally coupled in the x direction. Further, the comb-type electrode CSE1 and the comb-type electrode CSE2 are arranged in such a manner that the electrodes ELA through ELD are alternately adjacent to each other. At this time, the distance between the electrodes ELA and ELB, the distance between the electrodes ELB and the ELC, and the distance between the electrodes ELC and ELD all become "L".

Then, the electrode ELA that configures part of the comb-type electrode CSE1 has a first portion P1 (A) and a second portion P2 (A) and further has a coupling portion CNP (A) that couples the first portion P1 (A) and the second portion P2 (A). At this time, the first portion P1 (A) of the electrode ELA is arranged to extend in the y direction. Further, the second portion P2 (A) of the electrode ELA extends in the y direction and is arranged deviated from the first portion P1 (A) in the x direction orthogonal to the y direction. Then, the coupling portion CNP (A) is arranged to extend in the x direction while coupling the first portion P1 (A) and the second portion P2 (A).

Likewise, the electrode ELC that configures part of the comb-type electrode CSE1 has a first portion P1 (C) and a second portion P2 (C) and further has a coupling portion CNP (C) that couples the first portion P1 (C) and the second portion P2 (C). At this time, the first portion P1 (C) of the electrode ELC is arranged to extend in the y direction. Further, the second portion P2 (C) of the electrode ELC extends in the y direction and is arranged deviated from the first portion P1 (C) in the x direction orthogonal to the y direction. Then, the coupling portion CNP (C) is arranged to extend in the x direction while coupling the first portion P1 (C) and the second portion P2 (C).

Also, the electrode ELB that configures part of the comb-type electrode CSE2 has a first portion P1 (B) and a second portion P2 (B) and further has a coupling portion CNP (B) that couples the first portion P1 (B) and the second portion P2 (B). At this time, the first portion P1 (B) of the electrode ELB is arranged to extend in the y direction. Further, the second portion P2 (B) of the electrode ELB extends in the y direction and is arranged deviated from the first portion P1 (B) in the x direction orthogonal to the y direction. Then, the coupling portion CNP (B) is arranged to extend in the x direction while coupling the first portion P1 (B) and the second portion P2 (B).

Likewise, the electrode ELD that configures part of the comb-type electrode CSE2 has a first portion P1 (D) and a second portion P2 (D) and further has a coupling portion CNP (D) that couples the first portion P1 (D) and the second portion P2 (D). At this time, the first portion P1 (D) of the electrode ELD is arranged to extend in the y direction. Further, the second portion P2 (D) of the electrode ELD extends in the y direction and is arranged deviated from the first portion P1 (D) in the x direction orthogonal to the y direction. Then, the coupling portion CNP (D) is arranged to extend in the x direction while coupling the first portion P1 (D) and the second portion P2 (D).

Incidentally, in FIG. 5A, the second portion P2 (B) of the electrode ELB and the first portion P1 (C) of the electrode ELC are arranged over a straight line (virtual straight line) extending in the y direction. The electrodes ELB and ELC are arranged to be point symmetric with respect to the central point of the virtual straight line in the y direction. Further, the electrodes ELA and ELD are also arranged to be point symmetric with respect to the central point thereof.

When attention is paid to the electrodes ELA and ELB adjacent to each other in the capacitive element CAP1 in the present embodiment, the electrode ELA is divided into the first portion P1 (A) and the second portion P2 (A). Further, the electrode ELB adjacent to the electrode ELA is also divided into the first portion P1 (B) and the second portion P2 (B). The first portion P1 (A) of the electrode ELA and the second portion P2 (B) of the electrode ELB are formed by first patterning using the same first mask, while the second portion P2 (A) of the electrode ELA and the first portion P1 (B) of the electrode ELB are formed by second patterning using the same second mask. That is, as shown in FIG. 5A, the first portion P1 (A) of the electrode ELA and the first portion P1 (B) of the electrode ELB both facing each other are formed by patterning using masks different from each other. Further, the second portion P2 (A) of the electrode. ELA and the second portion P2 (B) of the electrode ELB are also formed by patterning using masks different from each other.

Likewise, when attention is paid to the electrodes ELC and ELD adjacent to each other, the electrode ELC is divided into the first portion P1 (C) and the second portion P2 (C). Further, the electrode ELD adjacent to the electrode ELC is also divided into the first portion P1 (D) and the second portion P2 (D). The first portion P1 (C) of the electrode ELC and the second portion P2 (D) of the electrode ELD are formed by first patterning using the same first mask, while the second portion P2 (C) of the electrode ELC and the first portion P1 (D) of the electrode ELD are formed by second patterning using the same second mask. That is, as shown in FIG. 5A, the first portion P1 (C) of the electrode ELC and the first portion P1 (D) of the electrode ELD both facing each other are formed by patterning using masks different to each other. Further, the second portion P2 (C) of the electrode ELC and the second portion P2 (D) of the electrode ELD both facing each other are also formed by patterning using masks different from each other.

Thus, according to the capacitive element CAP1 in the present embodiment, it is possible to suppress a variation in the capacity value even when the positional displacement occurs between the first mask used in the first patterning and the second mask used in the second patterning.

Assume that for example, as shown in FIG. 5B, the position of the second mask used in the second patterning is displaced by "a" in the x direction (right side) with respect to the position of the first mask used in the first patterning.

When attention is paid to the electrodes ELA and ELB adjacent to each other in this case, as shown in FIG. 5B, the first portion P1 (B) of the electrode ELB arranged on the right side is further shifted to the right side in the relation between the first portion P1 (A) of the electrode ELA and the first portion P1 (B) of the electrode ELB. Thus, the distance between the first portion P1 (A) of the electrode ELA and the first portion P1 (B) of the electrode ELB both facing each other extends to "L+a". As a result, in the relation between the first portion P1 (A) of the electrode ELA and the first portion P1 (B) of the electrode ELB, a change in the capacity due to the positional displacement between the masks becomes a change in the direction in which the capacity is reduced.

On the other hand, as shown in FIG. 5B, the second portion P2 (A) of the electrode ELA arranged on the left side is shifted to the right side in the relation between the second portion P2 (A) of the electrode ELA and the second portion P2 (B) of the electrode ELB. Thus, the distance between the second portion P2 (A) of the electrode ELA and the second portion P2 (B) of the electrode ELB both facing each other is narrowed to "L−a". As a result, in the relation between the second portion P2 (A) of the electrode ELA and the second portion P2 (B) of the electrode ELB, a change in the capacity due to the positional displacement between the masks becomes a change in the direction in which the capacity becomes larger.

Thus, when the entire capacity related to the electrodes ELA and ELB is considered, a change in the entire capacity due to the positional displacement between the masks is canceled and reduced by a decrease in the capacity between the first portion P1 (A) of the electrode ELA and the first portion P1 (B) of the electrode ELB and an increase in the capacity between the second portion P2 (A) of the electrode ELA and the second portion P2 (B) of the electrode ELB. As a result, according to the capacitive element CAP1 in the present embodiment, the variation in the capacity between the electrodes ELA and ELB due to the positional displacement between the masks can be reduced, thereby making it possible to suppress the variation in the characteristics of the semiconductor device.

Likewise, when attention is paid to the electrodes ELB and ELC adjacent to each other, as shown in FIG. 5B, the first portion P1 (B) of the electrode ELB arranged on the left side is shifted to the right side in the relation between the first portion P1 (B) of the electrode ELB and the first portion P1 (C) of the electrode ELC, so that the distance between the first portion P1 (B) of the electrode ELB and the first portion P1 (C) of the electrode ELC both facing each other is narrowed to "L−a". As a result, in the relation between the first portion P1 (B) of the electrode ELB and the first portion P1 (C) of the electrode ELC, a change in the capacity due to the positional displacement between the masks becomes a change in the direction in which the capacity becomes larger.

On the other hand, as shown in FIG. 5B, the second portion P2 (C) of the electrode ELC arranged on the right side is further shifted to the right side in the relation between the second portion P2 (B) of the electrode ELB and the second portion P2 (C) of the electrode ELC. Thus, the distance between the second portion P2 (B) of the electrode ELB and the second portion P2 (C) of the electrode ELC both facing each other extends to "L+a". As a result, in the relation between the second portion P2 (B) of the electrode ELB and the second portion P2 (C) of the electrode ELC, a change in the capacity due to the positional displacement between the masks becomes a change in the direction in which the capacity is reduced.

Thus, when the entire capacity related to the electrodes ELB and ELC is considered, a change in the entire capacity due to the positional displacement between the masks is canceled and reduced by an increase in the capacity between the first portion P1 (B) of the electrode ELB and the first portion P1 (C) of the electrode ELC and a decrease in the capacity between the second portion P2 (B) of the electrode ELB and the second portion P2 (C) of the electrode ELC. As a result, according to the capacitive element CAP1 in the present embodiment, the variation in the capacity between the electrode ELB and the electrode ELC due to the positional displacement between the masks can be reduced, thereby making it possible to suppress the variation in the characteristics of the semiconductor device.

Further, when attention is paid to the electrodes ELC and ELD adjacent to each other, as shown in FIG. 5B, the first portion P1 (D) of the electrode ELD arranged on the right side is further shifted to the right side in the relation between the first portion P1 (C) of the electrode ELC and the first portion P1 (D) of the electrode ELD, so that the distance between the first portion P1 (C) of the electrode ELC and the first portion P1 (D) of the electrode ELD both facing each other extends to "L+a". As a result, in the relation between the first portion P1 (C) of the electrode ELC and the first portion P1 (D) of the electrode ELD, a change in the capacity due to the positional displacement between the masks becomes a change in the direction in which the capacity becomes smaller.

On the other hand, as shown in FIG. 5B, the second portion P2 (C) of the electrode ELC arranged on the left side is shifted to the right side in the relation between the second portion P2 (C) of the electrode ELC and the second portion P2 (D) of the electrode ELD, so that the distance between the second portion P2 (C) of the electrode ELC and the second portion P2 (D) of the electrode ELD both facing each other is narrowed to "L−a". As a result, in the relation between the second portion P2 (C) of the electrode ELC and the second portion P2 (D) of the electrode ELD, a change in the capacity due to the positional displacement between the masks becomes a change in the direction in which the capacity becomes larger.

Thus, when the entire capacity related to the electrodes ELC and ELD is considered, a change in the entire capacity due to the positional displacement between the masks is canceled and reduced by a decrease in the capacity between the first portion P1 (C) of the electrode ELC and the first portion P1 (D) of the electrode ELD and an increase in the capacity between the second portion P2 (C) of the electrode ELC and the second portion P2 (D) of the electrode ELD. As a result, according to the capacitive element CAP1 in the present embodiment, the variation in the capacity between the electrodes ELC and ELD due to the positional displacement between the masks can be reduced, thereby making it possible to suppress the variation in the characteristics of the semiconductor device.

Since the variation in the capacity formed by the electrodes ELA and ELB, the variation in the capacity formed by the electrodes ELB and ELC, and the variation in the capacity formed by the electrodes ELC and ELD can be reduced as described above, it is possible to provide the high-precision capacitive element CAP1 that has reduced an influence of the variation in the characteristics due to the positional displacement between the masks according to the present embodiment. Particularly, it is desirable that from the viewpoint of effectively suppressing the variation in the capacity value, the area of the first patterning and the area of the second patterning are approximately equalized.

A description will next be made from the quantitative viewpoint, about the point that the variation in the capacity due to the positional displacement between the masks can be suppressed as compared with the capacitive element CAP (R) in the related art shown in FIGS. 1A and 1B according to the capacitive element CAP1 in the present embodiment shown in FIGS. 5A and 5B.

First, FIG. 5A shows the case where the electrodes ELA through ELD are formed in the state in which no positional displacement occurs between the first mask used in the first patterning and the second mask used in the second patterning in the double patterning method. In this case, the interval between the electrodes ELA and ELB, the interval between the electrodes ELB and ELC, and the interval between the electrodes ELC and ELD are all equal to each other and respectively become "L", for example. Thus, the capacity between the electrodes ELA and ELB, the capacity between the electrodes ELB and ELC, and the capacity between the electrodes ELC and ELD are all equal to each other. For example, the capacitance values thereof are taken to be "C". At this time, the capacitance value of the capacitive element CAP1 in the present embodiment becomes "3C" (design value) because the three inter-electrode capacities described above are coupled in parallel.

Subsequently, FIG. 5B is a diagram showing the case where the electrodes ELA through ELD are formed in the state in which the second mask used in the second patterning is positionally displaced by "a" in the x direction with respect to the first mask used in the first patterning. In FIG. 5B, as a result of the positional displacement of the second mask by "a" in the x direction with respect to the first mask, the capacity of the capacitive element CAP1 in the state in which the positional displacement exists between the masks is represented like an equation (3) shown below:

$$1 \cdot C \cdot L/(L-a) + 1 \cdot C \cdot L/(L+a) + \\ 1/2 \cdot C \cdot L/(L-a) + 1/2 \cdot C \cdot L/(L+a) = \\ \{1.5 \cdot C \cdot L \cdot (L+a) + 1.5 \cdot C \cdot L \cdot (L-a)\}/\{(L+a)(L-a)\} = \\ 3 \cdot C \cdot L/\{(L+a)(L-a)\} \quad (3)$$

Accordingly, the difference that occurs between the case where the positional displacement exists between the masks and the case where no positional displacement exists therebetween is represented like an equation (4):

$$\text{Difference} = 3 \cdot C - (3 \cdot C \cdot L \cdot L)/\{L+a\}(L-a)\} \quad (4)$$
$$= -3 \cdot C \cdot a \cdot a/\{(L+a)(L-a)\}$$

From the above, when the positional displacement exists between the masks in the double patterning method, the capacitance value of the capacitive element CAP1 in the present embodiment is varied by the difference expressed in the equation (4) from "3C" (design value).

Here, the variation in the capacity of the capacitive element CAP (R) in the related art is expressed in the equation (2), and the variation in the capacity of the capacitive element CAP1 in the present embodiment is expressed in the equation (4). Accordingly, when the difference between the equations (2) and (4) is taken to compare the magnitude of the variation in the capacity of the capacitive element CAP1 in the present embodiment with that of the variation in the capacity of the capacitive element CAP (R) in the related art, it is represented like an equation (5):

$$\text{(Equation 2)}-\text{(Equation 4)}=C \cdot L \cdot a/\{(L+a)(L-a)\} \quad (5)$$

That is, the variation in the capacity of the capacitive element CAP (R) in the related art becomes larger by the amount expressed in the equation (5) than the variation in the capacity of the capacitive element CAP1 in the present embodiment. In other words, according to the capacitive element CAP1 in the present embodiment, it is possible to reduce the variation in its capacity by the amount expressed in the equation (5) more than the variation in the capacity of the capacitive element CAP (R) in the related art.

Thus, according to the capacitive element CAP1 in the present embodiment, the variation in the capacity due to the positional displacement between the masks can be reduced even by using the double patterning method, whereby the high-precision capacitive element CAP1 can be provided. That is, according to the present embodiment, it is possible to provide the capacitive element CAP1 that suppresses the variation in the characteristics of the capacitive element CAP1 due to the mask misalignment and is high in precision, while maintaining the advantage of double patterning capable of coping with the microminiaturization exceeding the performance limit of the microfabrication technology using the single mask.

Further, even in the capacitive element CAP1 in the present embodiment, as shown in FIGS. 5A and 5B, for example, the electrode ELA is formed from the configuration of coupling of the first portion P1 (A) and the second portion P2 (A) by the coupling portion CNP (A), and the electrode ELB is formed from the configuration of coupling of the first portion P1 (B) and the second portion P2 (B) by the coupling portion CNP (B). Likewise, in the capacitive element CAP1 in the present embodiment, the electrode ELC is formed from the configuration of coupling of the first portion P1 (C) and the second portion P2 (C) by the coupling portion CNP (C), and the electrode ELD is formed from the configuration of coupling of the first portion P1 (D) and the second portion P2 (D) by the coupling portion CNP (D). Thus, according to the present embodiment, degradation of the reliability of coupling between the first and second portions due to the positional displacement between the masks can be suppressed at the respective electrodes ELA through ELD by adopting the electrode structure having the above-described coupling portions CNP (A) through CNP (D) while maintaining the advantage that the variation in the capacity due to the positional displacement between the masks can be suppressed.

<First Modification>

Figure 6:
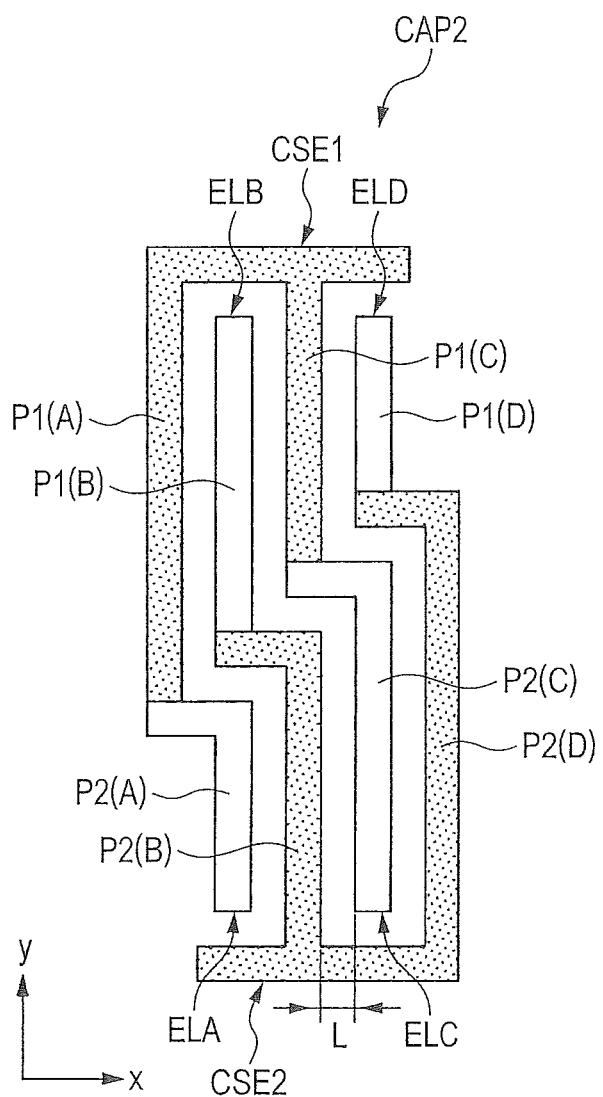
FIG. 6 is a diagram showing a planar configuration of a capacitive element in a first modification of the first embodiment.

A description will next be made about a capacitive element CAP2 in the present modification. FIG. 6 is a diagram showing a planar configuration of the capacitive element CAP2 in the present modification. Since the capacitive element CAP2 in the present modification shown in FIG. 6 is nearly similar in configuration to the capacitive element CAP1 in the first embodiment shown in FIG. 5A, the capacitive element CAP2 will be described centering on differences therebetween.

In FIG. 6, in the capacitive element CAP2 in the present modification, for example, a coupling portion that couples a first portion P1 (A) of an electrode ELA and a second portion P2 (A) thereof is formed integrally with the second portion P2 (A). Similarly, in the capacitive element CAP2 in the present modification, a coupling portion that couples a first portion P1 (B) of an electrode ELB and a second portion P2 (B) thereof is formed integrally with the second portion P2 (B). A coupling portion that couples a first portion P1 (C) of an electrode ELC and a second portion P2 (C) thereof is formed integrally with the second portion P2 (C). Further, a coupling portion that couples a first portion P1 (D) of an electrode ELD and a second portion P2 (D) thereof is formed integrally with the second portion P2 (D). In this case, the first portions, the second portions and the coupling portions are formed with the same layer at the electrodes ELA through ELD.

According to the configuration of such a modification, since the coupling portions can be formed simultaneously by patterning of the second portions, the manufacturing process of the capacitive element CAP2 can be simplified even while using the double patterning method.

Incidentally, the present modification has described the example in which the coupling portion and the second portion are formed integrally, but is not limited to this. For example, the coupling portion and the first portion can also be formed integrally.

<Second Modification>

Figure 7:
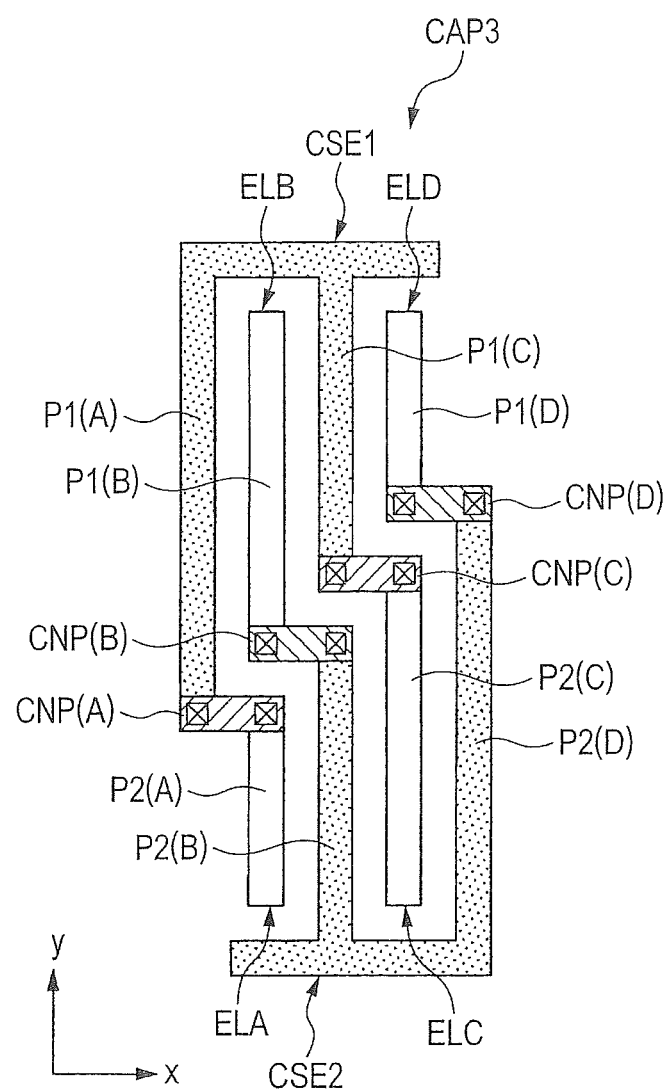
FIG. 7 is a diagram illustrating a planar configuration of a capacitive element in a second modification of the first embodiment.

A description will next be made about a capacitive element CAP3 in the present modification. FIG. 7 is a diagram showing a planar configuration of the capacitive element CAP3 in the present modification. Since the capacitive element CAP3 in the present modification shown in FIG. 7 is nearly similar in configuration to the capacitive element CAP1 in the first embodiment shown in FIG. 5A, the capacitive element CAP3 will be described centering on differences therebetween.

In FIG. 7, in the capacitive element CAP3 in the present modification, for example, a coupling portion that couples a first portion P1 (A) of an electrode ELA and a second portion P2 (A) thereof is formed with a layer different from the first portion P1 (A) and the second portion P2 (A). Likewise, in the capacitive element CAP3 in the present modification, a coupling portion that couples a first portion P1 (B) and a second portion P2 (B) of an electrode ELB is formed with a layer different from the first portion P1 (B) and the second portion P2 (B). A coupling portion that couples a first portion P1 (C) and a second portion P2 (C) of an electrode ELC is formed with a layer different from the first portion P1 (C) and the second portion P2 (C). Further, a coupling portion that couples a first portion P1 (D) and a second portion P2 (D) of an electrode ELD is formed with a layer different from the first portion P1 (D) and the second portion P2 (D).

In this case, for example, at each of the electrodes ELA through ELD, the coupling portion that couples the first portion and the second portion is formed in a layer above or below the layer formed with the first and second portions. The coupling of the coupling portion and the first portion, and the coupling of the coupling portion and the second portion are performed through plugs, for example.

<Third Modification>

Figure 8:
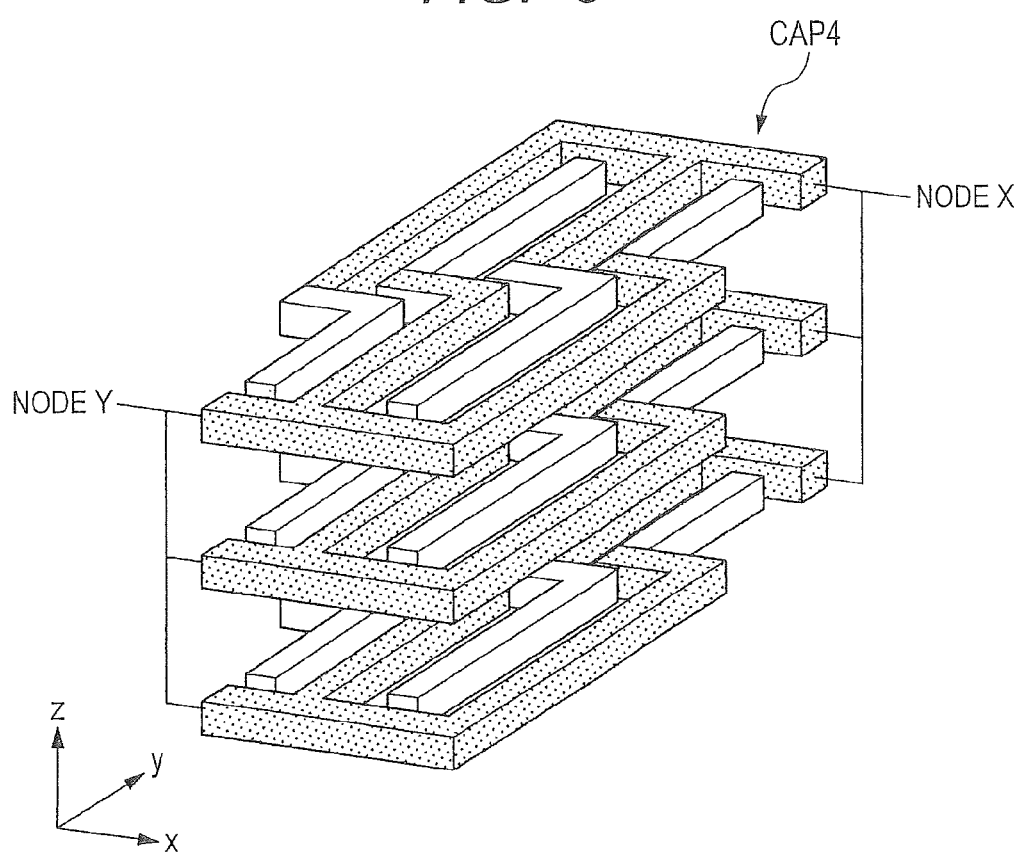
FIG. 8 is a typical diagram depicting a configuration of a capacitive element in a third modification of the first embodiment.

Subsequently, a description will be made about a capacitive element CAP4 in the present modification. FIG. 8 is a typical diagram showing the configuration of the capacitive element CAP4 in the present modification. As shown in FIG. 8, for example, the capacitive element CAP4 in the present modification takes a three-dimensional structure in which capacities are formed over a plurality of layers. Even in the capacitive element CAP4 having such a three-dimensional structure, the technical concept in the first embodiment can be applied to the capacity formed in each layer.

Specifically, in FIG. 8, the capacity provided with the first and second feature points of the first embodiment is formed in each of the three layers laminated on each other. One electrode of each of the laminated and arranged capacities is coupled to a common node X, and the other electrode of each of the capacities is coupled to a common node Y. Thus, the technical concept in the first embodiment can be applied not only to the capacitive element formed in one plane, but also to the capacitive element CAP4 having such a three-dimensional structure as shown in FIG. 8.

<Fourth Modification>

Figure 9:
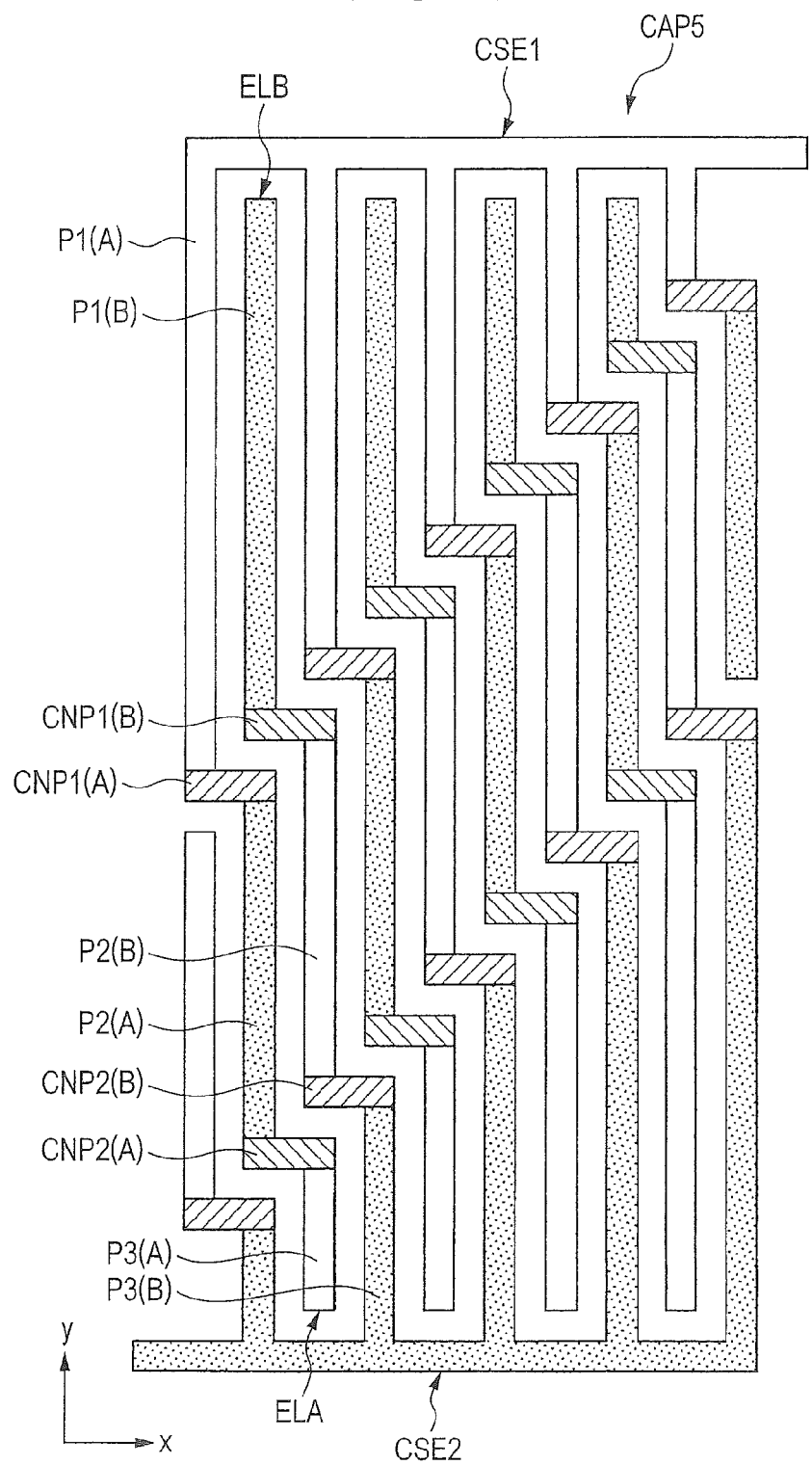
FIG. 9 is a diagram showing a planar configuration of a capacitive element in a fourth modification of the first embodiment.

A description will next be made about a capacitive element CAP5 in the present modification. FIG. 9 is a diagram showing a planar configuration of the capacitive element CAP5 in the present modification. Since the capacitive element CAP5 in the present modification shown in FIG. 9 is nearly similar in configuration to the capacitive element CAP1 in the first embodiment shown in FIG. 5A, the capacitive element CAP5 will be described centering on differences therebetween.

In FIG. 9, the feature point of the present modification will be described below by paying attention to an electrode ELA that configures part of a comb-type electrode CSE1 and an electrode ELB that configures part of a comb-type electrode CSE2. As shown in FIG. 9, the electrodes ELA and ELB are arranged in positions adjacent to each other and extend to run side by side with each other while maintaining them with a prescribed distance from each other.

Here, the feature point of the present modification resides in that the electrode ELA is divided into a first portion P1 (A), a second portion P2 (A) and a third portion P3 (A) and that the first portion P1 (A) and the second portion P2 (A) are coupled by a first coupling portion CNP1 (A) and the second portion P2 (A) and the third portion P3 (A) are coupled by a second coupling portion CNP2 (A). That is, in the first embodiment shown in FIG. 5A, the electrode ELA has been divided into the two portions and configured to have one coupling portion that couples the divided portions to each other. On the other hand, the capacitive element CAP5 in the present modification shown in FIG. 9 differs from the capacitive element CAP1 in the first embodiment in that the electrode ELA is divided into the three portions and configured to have the two coupling portions that couple the divided portions to each other.

Likewise, in the present modification, as shown in FIG. 9, the electrode ELB is also divided into a first portion P1 (B), a second portion P2 (B) and a third portion P_3 (B). The first portion P1 (B) and the second portion P2 (B) are coupled by a first coupling portion CNP1 (B), and the second portion P2 (B) and the third portion P3 (B) are coupled by a second coupling portion CNP2 (B).

The first feature point of the first embodiment is reflected even to the capacitive element CAP5 in the present modification configured in this way. That is, when attention is paid to the electrodes ELA and ELB adjacent to each other, the electrode ELA is divided into the first portion P1 (A), the second portion P2 (A) and the third portion P3 (A), and the electrode ELB adjacent to the electrode ELA is also divided into the first portion P1 (B), the second portion P2 (B) and the third portion P3 (B).

Then, the first portion P1 (A) of the electrode ELA, the second portion P2 (B) of the electrode ELB, and the third portion P3 (A) of the electrode ELA are formed by first patterning using the same first mask, while the second portion P2 (A) of the electrode ELA, the first portion P1 (B) of the electrode ELB, and the third portion P3 (B) of the electrode ELB are formed by second patterning using the same second mask. That is, even in the present modification, as shown in FIG. 9, the first portion P1 (A) of the electrode ELA and the first portion P1 (B) of the electrode ELB both facing each other are formed by patterning using masks different from each other, and the second portion P2 (A) of the electrode ELA and the second portion P2 (B) of the electrode ELB both facing each other are also formed by patterning using masks different from each other. Further, the third portion P3 (A) of the electrode ELA and the third portion P3 (B) of the electrode ELB both facing each other are formed by patterning using masks different from each other.

As a result, since the present modification also has the first feature point in a manner similar to the first embodiment, it is possible to provide the high-precision capacitive element CAP5 that has reduced an influence of the variation in the characteristics due to the positional displacement between the masks. The present modification is similar to the first embodiment particularly in that it is desirable that from the viewpoint of effectively suppressing the variation in the capacity value, the area of the first patterning and the area of the second patterning are approximately equalized.

Further, the present modification also has the second feature point in a manner similar to the first embodiment. That is, even in the present modification, as shown in FIG. 9, for example, the electrode ELA is formed from the configuration that the first portion P1 (A) and the second portion P2 (A) are coupled by the first coupling portion CNP1 (A), and the second portion P2 (A) and the third portion P3 (A) are coupled by the second coupling portion CNP2 (A). Likewise, in the present modification, the electrode ELB is formed from the configuration that the first portion P1 (B) and the second portion P2 (B) are coupled by the first coupling portion CNP1 (B), and the second portion P2 (B) and the third portion P3 (B) are coupled by the second coupling portion CNP2 (B).

Thus, according to the present modification, degradation of the reliability of coupling between the first and second portions and degradation of the reliability of coupling between the second and third portions both caused by the positional displacement between the masks can be suppressed at the respective electrodes ELA and ELB by adopting the electrode structure having the first and second coupling portions.

<Fifth Modification>

Figure 10:
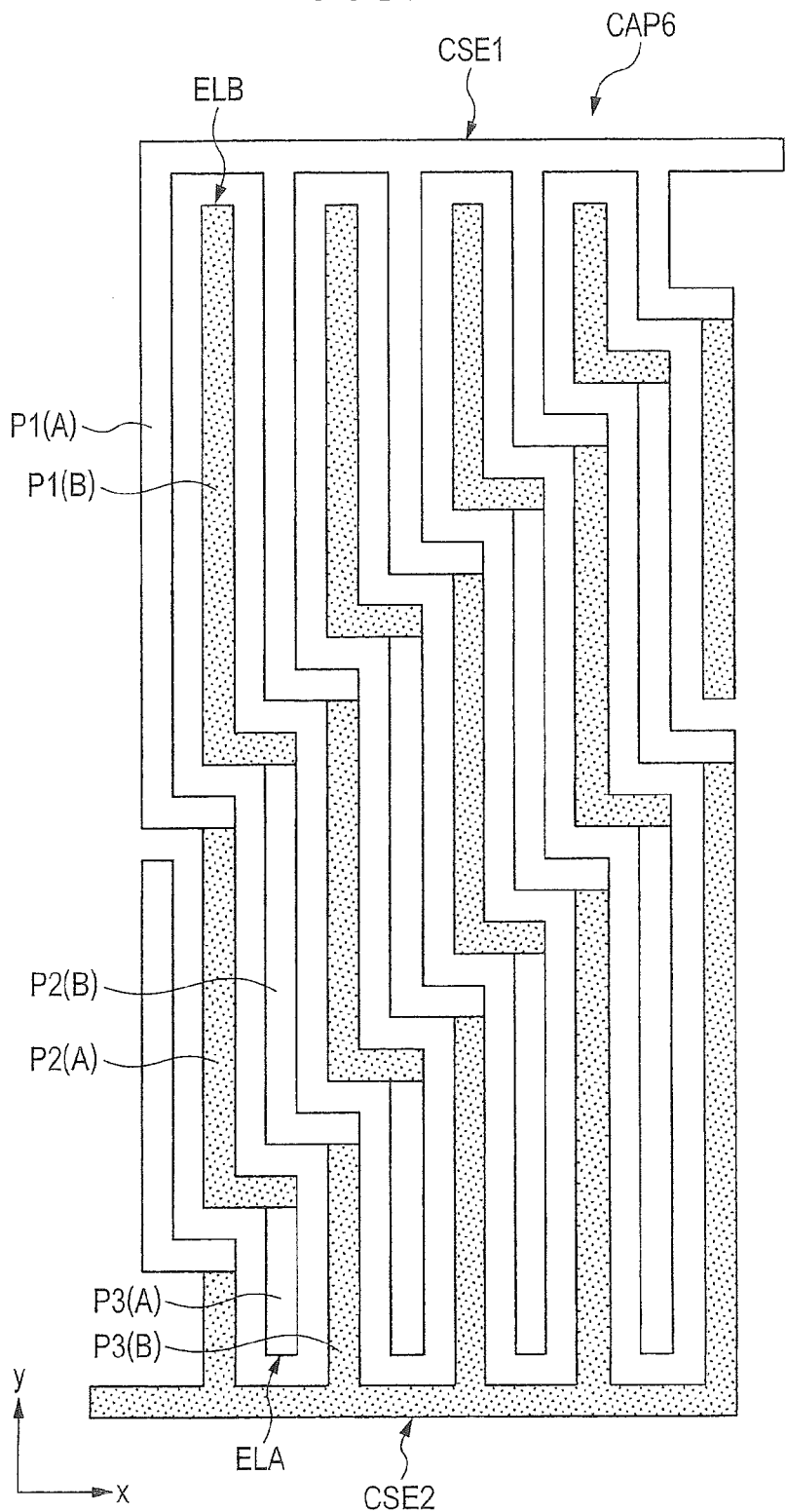
FIG. 10 is a diagram illustrating a planar configuration of a capacitive element in a fifth modification of the first embodiment.

Subsequently, a description will be made about a capacitive element CAPE in the present modification. The capacitive element CAP6 in the present modification corresponds to a combined configuration of the configuration of the fourth modification and the configuration of the first modification. FIG. 10 is a diagram showing a planar configuration of the capacitive element CAP6 in the present modification.

Since the capacitive element CAP6 in the present modification also has the first and second feature points as shown in FIG. 10, the present modification can obtain an advantageous effect similar to the first embodiment. That is, even in the present modification, it is possible to provide the high-precision capacitive element CAP6 having reduced an influence of a variation in the characteristics due to the positional displacement between masks and suppress degradation of the reliability of coupling between the first and second portions and degradation of the reliability of coupling between the second and third portions both caused by the positional displacement between the masks.

Further, in the present modification, for example, a first coupling portion that couples a first portion P1 (A) and a second portion P2 (A) of an electrode ELA is formed integrally with the first portion P1 (A), and a second coupling portion that couples the second portion P2 (A) of the electrode ELA and a third portion P3 (A) thereof is formed integrally with the second portion P2 (A). Likewise, in the present modification, a first coupling portion that couples a first portion P1 (B) and a second portion P2 (B) of an electrode ELB is formed integrally with the first portion P1 (B), and a second coupling portion that couples the second portion P2 (B) of the electrode ELB and a third portion P3 (B) thereof is formed integrally with the second portion P2 (B).

Thus, according to the configuration of the present modification, the first coupling portion can also be formed simultaneously by patterning of the first portion, and the second coupling portion can also be formed simultaneously by patterning of the second portion, thereby making it possible to simplify the manufacturing process of the capacitive element CAP6 even while using the double patterning method.

<Sixth Modification>

Figure 11:
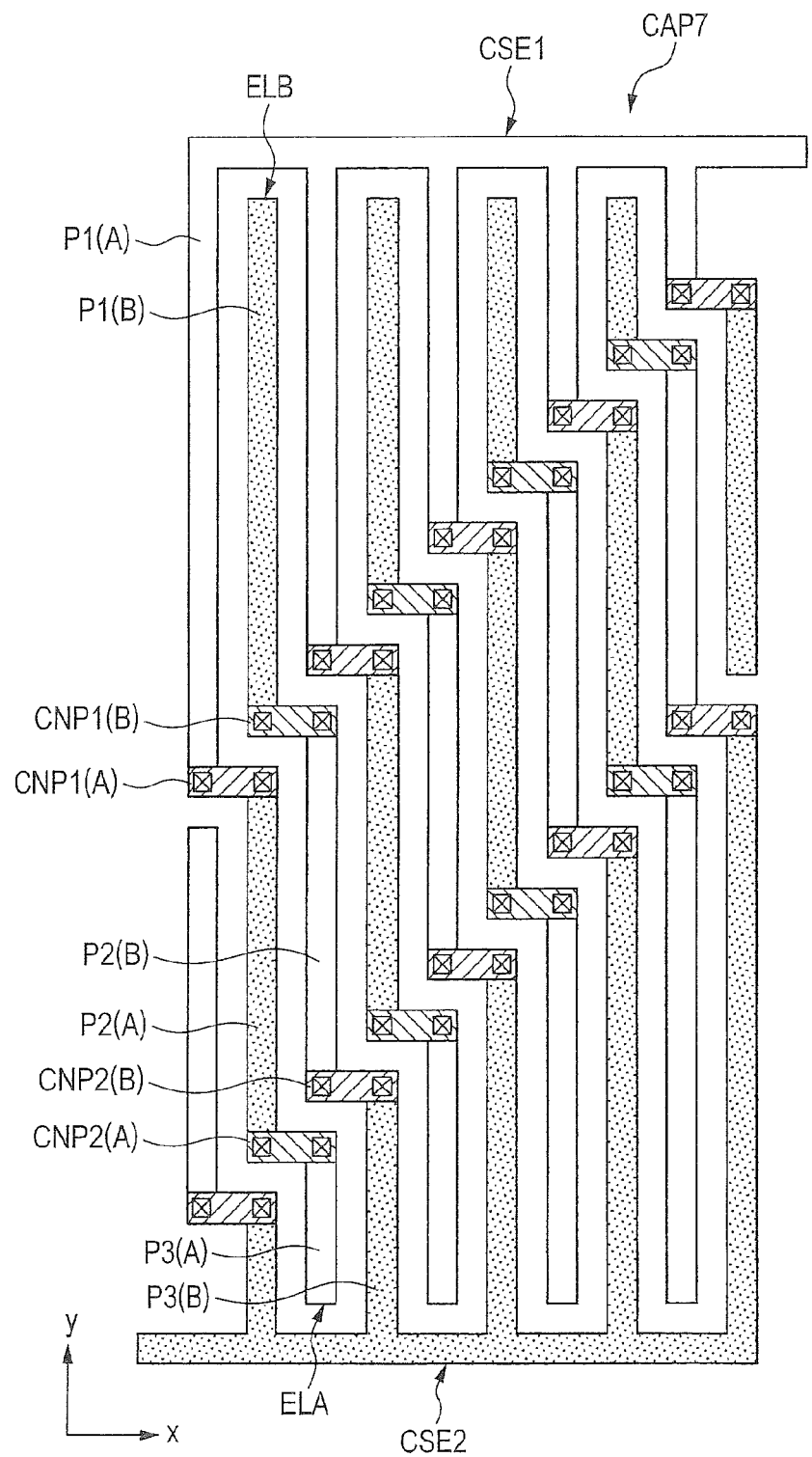
FIG. 11 is a diagram showing a planar configuration of a capacitive element in a sixth modification of the first embodiment.

A description will be made about a capacitive element CAP7 in the present modification. The capacitive element CAP7 in the present modification corresponds to a combined configuration of the configuration of the fourth modification and the configuration of the second modification. FIG. 11 is a diagram showing a planar configuration of the capacitive element CAP7 in the present modification.

Since the capacitive element CAP7 in the present modification also has the first and second feature points as shown in FIG. 11, the present modification can obtain an advantageous effect similar to the first embodiment. That is, even in the present modification, it is possible to provide the high-precision capacitive element CAP7 having reduced an influence of a variation in the characteristics due to the positional displacement between masks and suppress degradation of the reliability of coupling between the first and second portions and degradation of the reliability of coupling between the second and third portions both caused by the positional displacement between the masks.

Further, in the present modification, for example, a first coupling portion CNP1 (A) that couples a first portion P1 (A) and a second portion P2 (A) of an electrode ELA is formed with a layer different from the first portion P1 (A) and the second portion P2 (A). Further, a second coupling portion CNP2 (A) that couples a second portion P2 (A) and a third portion P3 (A) of the electrode ELA is also formed with a layer different from the second portion P2 (A) and the third portion P3 (A). Likewise, in the present modification, a first coupling portion CNP1 (B) that couples a first portion P1 (B) and a second portion P2 (B) of an electrode ELB is formed with a layer different from the first portion P1 (B) and the second portion P2 (A). Further, a second coupling portion CNP2 (B) that couples a second portion P2 (B) and a third portion P3 (B) of the electrode ELB is formed with a layer different from the second portion P2 (B) and the third portion P3 (A).

In this case, for example, at each of the electrodes ELA and ELB, the first coupling portion that couples the first portion and the second portion is formed in a layer above or below the layer formed with the first and second portions. The coupling of the first coupling portion and the first portion, and the coupling of the first coupling portion and the second portion are performed through plugs, for example. Likewise, the second coupling portion that couples the second portion and the third portion is formed in a layer above or below the layer formed with the second and third portions. The coupling of the second coupling portion and the second portion, and the coupling of the second coupling portion and the third portion are performed through plugs, for example.

<Seventh Modification>

Figure 12:
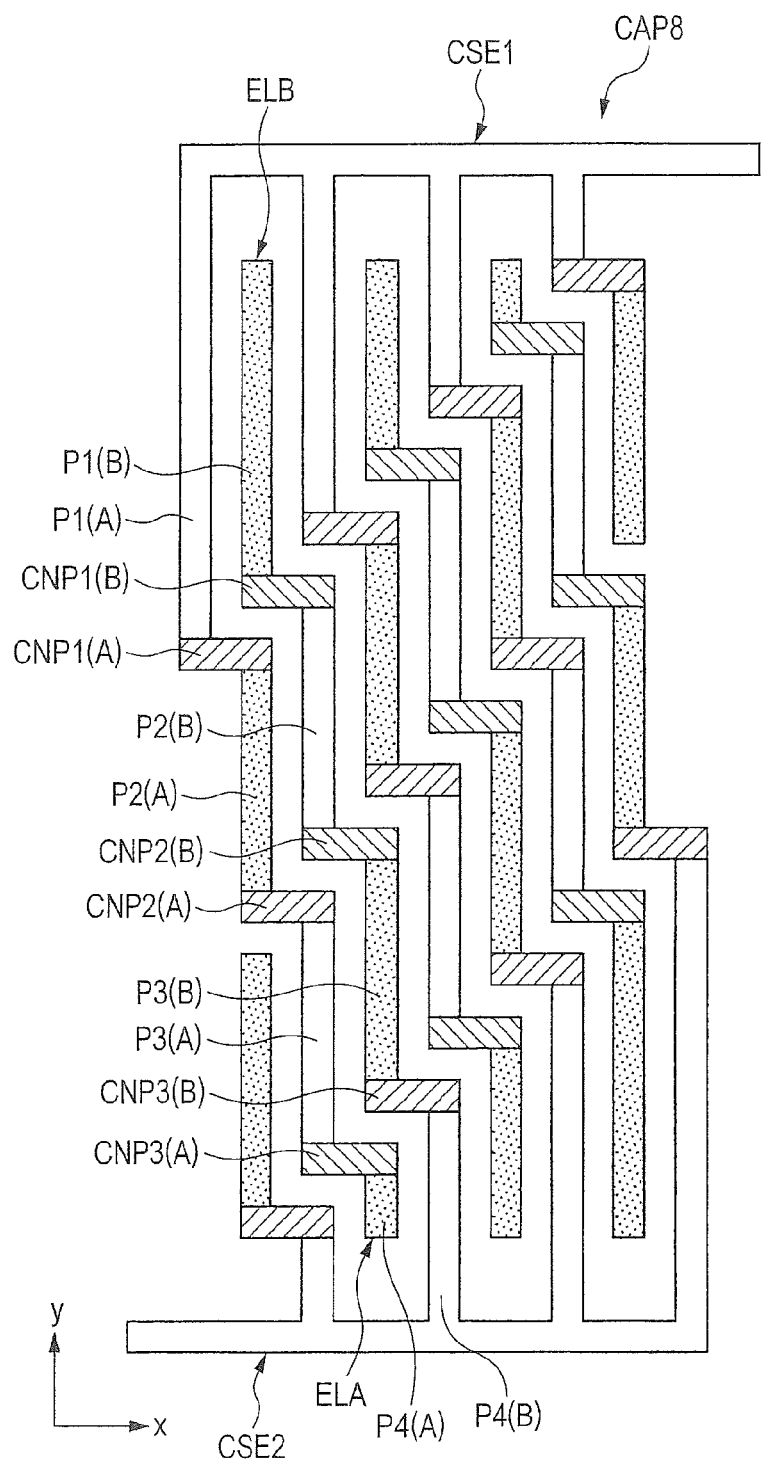
FIG. 12 is a diagram depicting a planar configuration of a capacitive element in a seventh modification of the first embodiment.

Subsequently, a description will be made about a capacitive element CAP8 in the present modification. FIG. 12 is a diagram showing a planar configuration of the capacitive element CAP8 in the present modification. Since the capacitive element CAP8 in the present modification shown in FIG. 12 is nearly similar in configuration to the capacitive element CAP1 in the first embodiment shown in FIG. 5A, the capacitive element CAP8 will be described centering on differences therebetween.

In FIG. 12, the feature point of the present modification will be described below by particularly paying attention to an electrode ELA that configures part of a comb-type electrode CSE1 and an electrode ELB that configures part of a comb-type electrode CSE2. As shown in FIG. 12, the electrodes ELA and ELB are arranged in positions adjacent to each other and extend to run side by side with each other while maintaining them with a prescribed distance from each other.

Here, in the present modification, as shown in FIG. 12, the electrode ELA is divided into a first portion P1 (A), a second portion P2 (A), a third portion P3 (A) and a fourth portion P4 (A). Further, the first portion P1 (A) and the second portion P2 (A) are coupled by a first coupling portion CNP1 (A). The second portion P2 (A) and the third portion P3 (A) are coupled by a second coupling portion CNP2 (A). The third portion P3 (A) and the fourth portion P4 (A) are coupled by a third coupling portion CNP3.

That is, in the first embodiment shown in FIG. 5A, the electrode ELA has been divided into the two portions and configured to have one coupling portion that couples the divided portions. On the other hand, the capacitive element CPA8 in the present modification shown in FIG. 12 differs from the capacitive element CAP1 in the first embodiment in that the electrode ELA are divided into the four portions and configured to have the three coupling portions that couple the divided portions.

Likewise, in the present modification, as shown in FIG. 12, the electrode ELB is also divided into a first portion P1 (B), a second portion P2 (B), a third portion P3 (B) and a fourth portion P4 (B). Further, the first portion P1 (B) and the second portion P2 (B) are coupled by a first coupling portion CNP1 (B). The second portion P2 (B) and the third portion P3 (B) are coupled by a second coupling portion CNP2 (B). The third portion P3 (B) and the fourth portion P4 (B) are coupled by a third coupling portion CNP3.

The first feature point in the first embodiment has been reflected even on the capacitive element CAP8 in the present modification configured in this manner. That is, when attention is paid to the electrodes ELA and ELB adjacent to each other, the first portion P1 (A) of the electrode ELA, the third portion P3 (A) of the electrode ELA, the second portion P2 (B) of the electrode ELB and the fourth portion P4 (B) of the electrode ELB are formed by first patterning using the same first mask. On the other hand, the second portion P2 (A) of the electrode ELA, the fourth portion P4 (A) of the electrode ELA, the first portion P1 (B) of the electrode ELB and the third portion P3 (B) of the electrode ELB are formed by second patterning using the same second mask. That is, even in the present modification, as shown in FIG. 12, the first portion P1 (A) of the electrode ELA and the first portion P1 (B) of the electrode ELB both facing each other are formed by patterning using masks different from each other, and the second portion P2 (A) of the electrode ELA and the second portion P2 (B) of the electrode ELB both facing each other are also formed by patterning using masks different from each other. Further, the third portion P3 (A) of the electrode ELA and the third portion P3 (B) of the electrode ELB both facing each other are also formed by patterning using masks different from each other, and the fourth portion P4 (A) of the electrode ELA and the fourth portion P4 (B) of the electrode ELB both facing each other are also formed by patterning using masks different from each other.

As a result, since the present modification also has the first feature point in a manner similar to the first embodiment, it is possible to provide the high-precision capacitive element CAP8 that has reduced an influence of a variation in the characteristics due to the positional displacement between the masks. The present modification is similar to the first embodiment particularly in that it is desirable that from the viewpoint of effectively suppressing the variation in the capacity value, the area of the first patterning and the area of the second patterning are approximately equalized.

Further, the present modification also has the second feature point in a manner similar to the first embodiment. That is, even in the present modification, as shown in FIG. 12, for example, the electrode ELA is formed from the configuration that the first portion P1 (A) and the second portion. P2 (A) are coupled by the first coupling portion CNP1 (A), the second portion P2 (A) and the third portion P3 (A) are coupled by the second coupling portion CNP2 (A), and the third portion P3 (A) and the fourth portion P4 (A) are coupled by the third coupling portion CNP3 (A). Likewise, in the present modification, the electrode ELB is formed from the configuration that the first portion P1 (B) and the second portion P2 (B) are coupled by the first coupling portion CNP1 (B), the second portion P2 (B) and the third portion P3 (B) are coupled by the second coupling portion CNP2 (B), and the third portion P3 (B) and the fourth portion P4 (B) are coupled by the third coupling portion CNP3 (B).

Thus, according to the present modification, degradation of the reliability of coupling between the first and second portions, degradation of the reliability of coupling between the second and third portions, and degradation of the reliability of coupling between the third and fourth portions, which are caused by the positional displacement between the masks, can be suppressed at the respective electrodes ELA and ELB by adopting the electrode structure having the first, second and third coupling portions.

<Eighth Modification>

Figure 13:
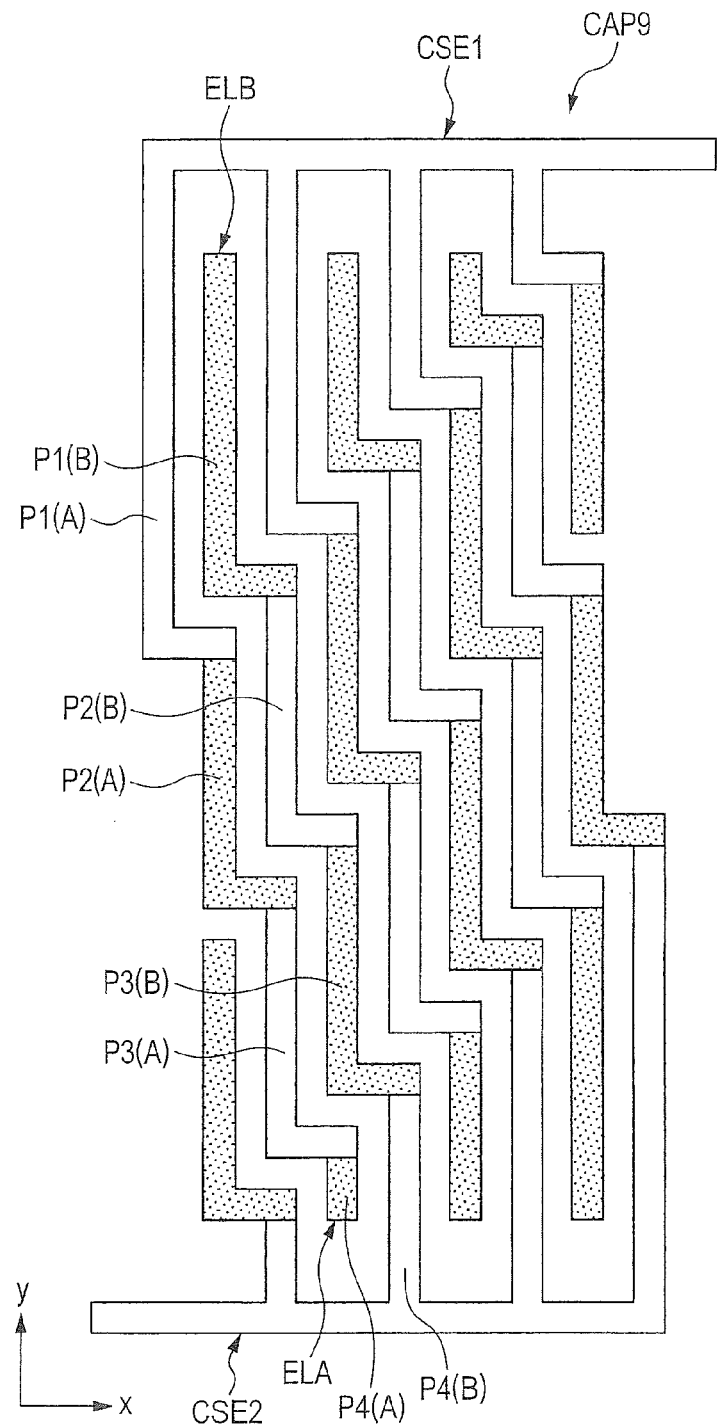
FIG. 13 is a diagram showing a planar configuration of a capacitive element in an eighth modification of the first embodiment.

A description will next be made about a capacitive element CAP9 in the present modification. The capacitive element CAP9 in the present modification corresponds to a combined configuration of the configuration of the seventh modification and the configuration of the first modification. FIG. 13 is a diagram showing a planar configuration of the capacitive element CAP9 in the present modification.

Since the capacitive element CAP9 in the present modification also has the first and second feature points as shown in FIG. 13, the present modification can obtain an advantageous effect similar to the first embodiment. That is, even in the present modification, it is possible to provide the high-precision capacitive element CAP9 having reduced an influence of a variation in the characteristics due to the positional displacement between masks and suppress degradation of the reliability of coupling between the first and second portions, degradation of the reliability of coupling between the second and third portions, and degradation of the reliability of coupling between the third and fourth portions, which are caused by the positional displacement between the masks.

Further, in the present modification, for example, a first coupling portion that couples a first portion P1 (A) and a second portion P2 (A) of an electrode ELA is formed integrally with the first portion P1 (A), and a second coupling portion that couples the second portion P2 (A) of the electrode ELA and a third portion P3 (A) thereof is formed integrally with the second portion P2 (A). Further, a third coupling portion that couples the third portion P3 (A) of the electrode ELA and a fourth portion P4 (A) thereof is formed integrally with the third portion P3 (A).

Likewise, in the present modification, a first coupling portion that couples a first portion P1 (B) and a second portion P2 (B) of an electrode ELB is formed integrally with the first portion P1 (B), and a second coupling portion that couples the second portion P2 (B) of the electrode ELB and a third portion P3 (B) thereof is formed integrally with the second portion P2 (B). Further, a third coupling portion that couples the third portion P3 (B) of the electrode ELB and a fourth portion P4 (B) thereof is formed integrally with the third portion P3 (B).

Thus, according to the configuration of the present modification, the first coupling portion and the third coupling portion can also be formed simultaneously by patterning of the first portion, and the second coupling portion can also be formed simultaneously by patterning of the second portion, thereby making it possible to simplify the manufacturing process of the capacitive element CAP5 even while using the double patterning method.

<Ninth Modification>

Figure 14:
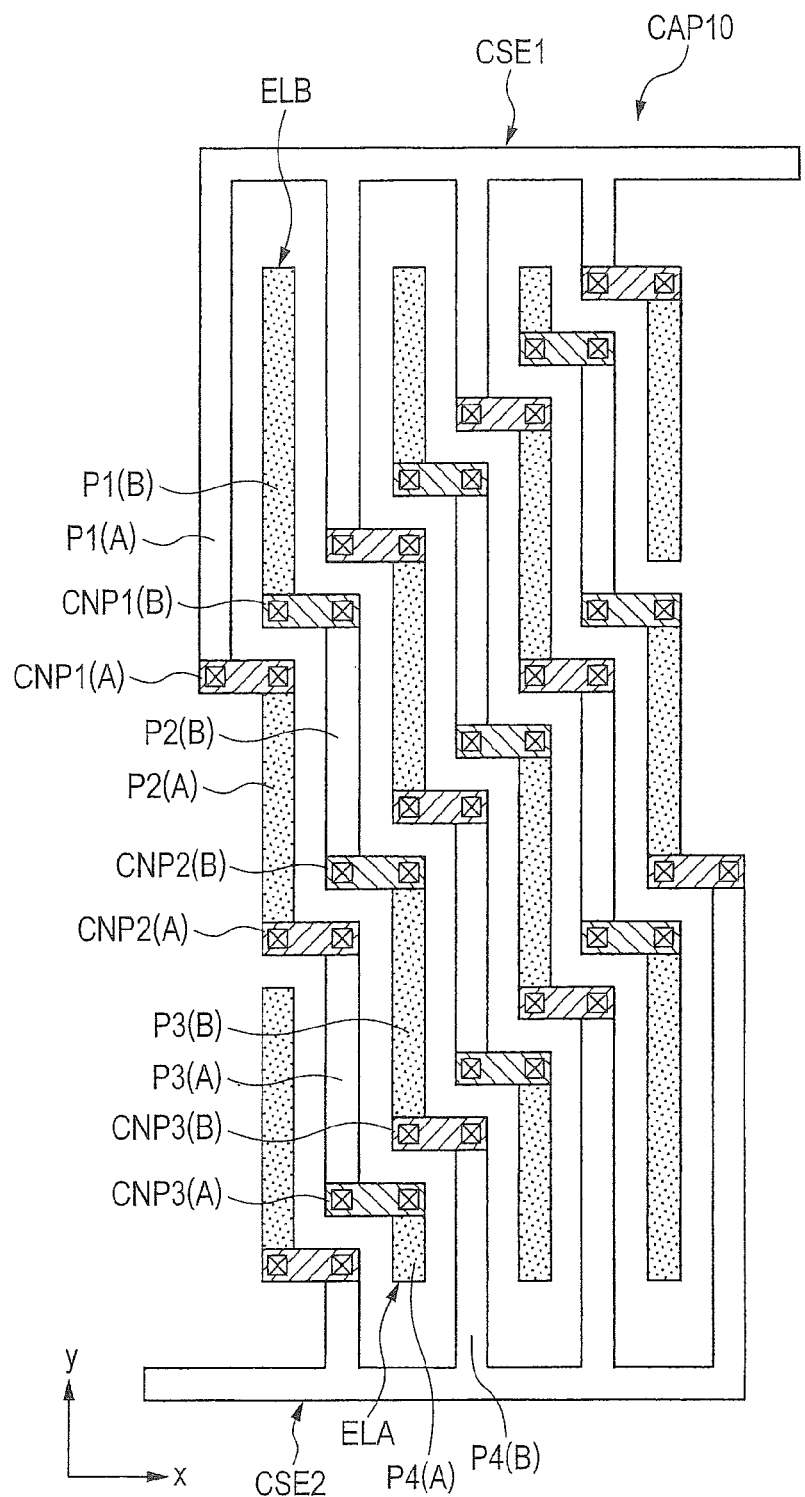
FIG. 14 is a diagram illustrating a planar configuration of a capacitive element in a ninth modification of the first embodiment.

Subsequently, a description will be made about a capacitive element CAP10 in the present modification. The capacitive element CAP10 in the present modification corresponds to a combined configuration of the configuration of the seventh modification and the configuration of the second modification. FIG. 14 is a diagram showing a planar configuration of the capacitive element CAP10 in the present modification. Since the capacitive element CAP10 in the present modification also has the first and second feature points as shown in FIG. 14, the present modification can obtain an advantageous effect similar to the first embodiment. That is, even in the present modification, it is possible to provide the high-precision capacitive element CAP10 having reduced an influence of a variation in the characteristics due to the positional displacement between masks and suppress degradation of the reliability of coupling between the first and second portions and degradation of the reliability of coupling between the second and third portions both caused by the positional displacement between the masks.

Further, in the present modification, for example, a first coupling portion CNP1 (A) that couples a first portion P1 (A) and a second portion P2 (A) of an electrode ELA is formed with a layer different from the first portion P1 (A) and the second portion P2 (A), and a second coupling portion CNP2 (A) that couples the second portion P2 (A) of the electrode ELA and a third portion P3 (A) thereof is also formed with a layer different from the second portion P2 (A) and the third portion P3 (A). Further, a third coupling portion CNP3 (A) that couples the third portion P3 (A) of the electrode ELA and a fourth portion P4 (A) thereof is formed with a layer different from the third portion P3 (A) and the fourth portion P4 (A).

Likewise, in the present modification, a first coupling portion CNP1 (B) that couples a first portion P1 (B) and a second portion P2 (B) of an electrode ELB is formed with a layer different from the first portion P1 (B) and the second portion P2 (A), and a second coupling portion CNP2 (B) that couples the second portion P2 (B) of the electrode ELB and a third portion P3 (B) thereof is formed with a layer different from the second portion P2 (B) and the third portion P3 (A). Further, a third coupling portion CNP3 (B) that couples the third portion P3 (B) of the electrode ELB and a fourth portion P4 (B) thereof is formed with a layer different from the third portion P3 (B) and the fourth portion P4 (B).

In this case, for example, at each of the electrodes ELA and ELB, the first coupling portion that couples the first portion and the second portion is formed in a layer above or below the layer formed with the first and second portions. The coupling of the first coupling portion and the first portion, and the coupling of the first coupling portion and the second portion are performed through plugs, for example. Likewise, the second coupling portion that couples the second portion and the third portion is formed in a layer above or below the layer formed with the second and third portions. The coupling of the second coupling portion and the second portion, and the coupling of the second coupling portion and the third portion are performed through plugs, for example. Further, the third coupling portion that couples the third portion and the fourth portion is formed in a layer above or below the layer formed with the third portion and the fourth portion. The coupling of the third coupling portion and the third portion, and the coupling of the third coupling portion and the fourth portion are performed through plugs, for example.

Second Embodiment

<Utility of Application of Basic Concept to Wiring>

Although the first embodiment has described the example in which the basic concept is applied to the capacitive element comprised of the conductor patterns, the second embodiment will describe an example in which the basic concept is applied to wirings comprised of conductor patterns.

For example, since the double patterning method has the advantage of being capable of coping with the microminiaturization exceeding the performance limit of the current microfabrication technology, it can cope with the formation of fine wirings hard to be processed in the microfabrication technology using the single mask. On the other hand, since there is a possibility that a positional displacement will occur between masks in the double patterning method, the distance between wirings is considered to be shifted from the design value due to the positional displacement between the masks. In this case, the parasitic capacity between the wirings is fluctuated.

Thus, the fluctuation in the parasitic capacity between the wirings means that the delay time of a signal to be transmitted through each wiring varies. Thus, when digital signals are considered as the types of signals transmitted through the wirings, control of the timing between the signals becomes important for the digital signals. Therefore, when the parasitic capacity between the wirings is fluctuated, the delay time of each digital signal also varies so that the timing between the digital signals is assumed to deviate. In this case, there is also considered a possibility that a digital circuit will not operate properly. It is thus necessary to reduce as much as possible, the fluctuation in the parasitic capacity between the wirings caused by the positional displacement between the masks from the viewpoint of improving the reliability of the operation of a semiconductor device.

It is therefore useful to apply the basic concept described in the first embodiment even to the formation of the wirings comprised of the conductor patterns. This will described below.

<Application Example of Basic Concept to Wiring>

Figure 15A:
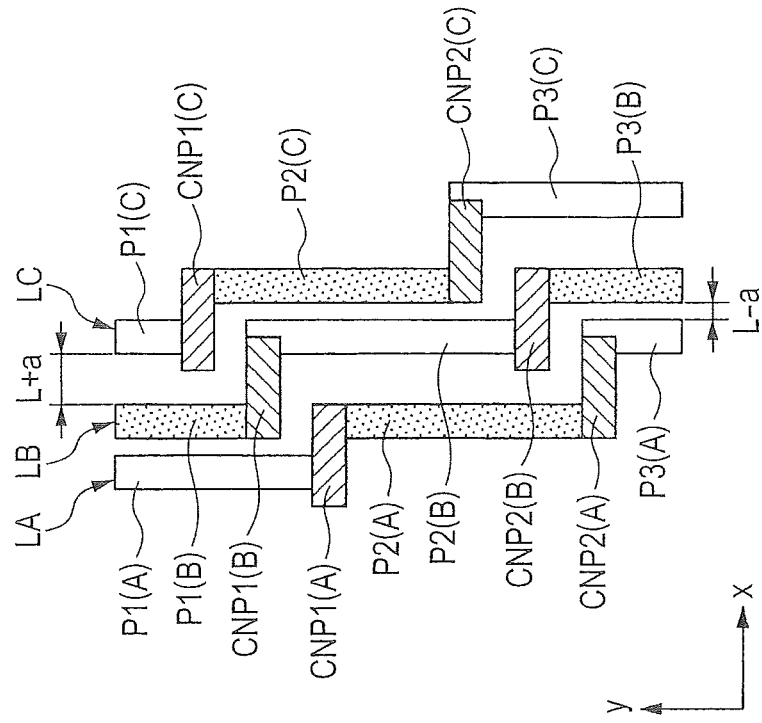
FIG. 15A is a diagram showing a planar configuration of a wiring group in a second embodiment.

FIG. 15A is a diagram showing a planar configuration of a wiring group in the second embodiment. In FIG. 15A, the wiring group in the present embodiment is provided with a wiring LA, a wiring LB and a wiring LC. At this time, the wiring LA, the wiring LB and the wiring LC are arranged to run side by side with each other. The distance between the wirings LA and LB and the distance between the wirings LB and LC both become "L".

Then, the wiring LA has a first portion P1 (A), a second portion P2 (A) and a third portion P3 (A) and further has a first coupling portion CNP1 (A) that couples the first portion P1 (A) and the second portion P2 (A), and a second coupling portion CNP2 (A) that couples the second portion P2 (A) and the third portion P3 (A). Here, the first portion P1 (A) of the wiring LA is arranged to extend in a y direction, and the second portion P2 (A) of the wiring LA extends in the y direction and is arranged deviated from the first portion P1 (A) in an x direction orthogonal to the y direction. Further, the third portion P3 (A) of the wiring LA extends in the y direction and is arranged deviated from the second portion P2 (A) in the x direction orthogonal to the y direction. Then, the first coupling portion CNP1 (A) is arranged to extend in the x direction while coupling the first portion P1 (A) and the second portion P2 (A). The second coupling portion CNP2 (A) is arranged to extend in the x direction while coupling the second portion P2 (A) and the third portion P3 (A).

Likewise, the wiring LB has a first portion P1 (B), a second portion P2 (B) and a third portion P3 (B) and further has a first coupling portion CNP1 (B) that couples the first portion P1 (B) and the second portion P2 (B), and a second coupling portion CNP2 (B) that couples the second portion P2 (B) and the third portion P3 (B). Here, the first portion P1 (B) of the wiring LB is arranged to extend in the y direction, and the second portion P2 (B) of the wiring LB extends in the y direction and is arranged deviated from the first portion P1 (B) in the x direction orthogonal to the y direction. Further, the third portion P3 (B) of the wiring LB extends in the y direction and is arranged deviated from the second portion P2 (B) in the x direction orthogonal to the y direction. The first coupling portion CNP1 (B) is arranged to extend in the x direction while coupling the first portion P1 (B) and the second portion P2 (B). The second coupling portion CNP2 (B) is arranged to extend in the x direction while coupling the second portion P2 (B) and the third portion P3 (B).

Further, the wiring LC has a first portion P1 (C), a second portion P2 (C) and a third portion P3 (C). Further, the wiring LC has a first coupling portion CNP1 (C) that couples the first portion P1 (C) and the second portion P2 (C), and a second coupling portion CNP2 (C) that couples the second portion P2 (C) and the third portion P3 (C). Here, the first portion P1 (C) of the wiring LC is arranged to extend in the y direction, and the second portion P2 (C) of the wiring LC extends in the y direction and is arranged deviated from the first portion P1 (C) in the x direction orthogonal to the y direction. Further, the third portion P3 (C) of the wiring LC extends in the y direction and is arranged deviated from the second portion P2 (C) in the x direction orthogonal to the y direction. The first coupling portion CNP1 (C) is arranged to extend in the x direction while coupling the first portion P1 (C) and the second portion P2 (C). The second coupling portion CNP2 (C) is arranged to extend in the x direction while coupling the second portion P2 (C) and the third portion P3 (C).

When attention is paid to the wirings LA and LB adjacent to each other in the wiring group in the second embodiment, the wiring LA is divided into the first portion P1 (A), the second portion P2 (A) and the third portion P3 (A). Further, the wiring LB adjacent to the wiring LA is also divided into the first portion P1 (B), the second portion P2 (B) and the third portion P3 (B). The first portion P1 (A) of the wiring LA, the third portion P3 (A) of the wiring LA and the second portion P2 (B) of the wiring LB are formed by first patterning using the same first mask. On the other hand, the second portion P2 (A) of the wiring LA, the first portion P1 (B) of the wiring LB and the third portion P3 (B) of the wiring LB are formed by second patterning using the same second mask. That is, as shown in FIG. 15A, the first portion P1 (A) of the wiring LA and the first portion P1 (B) of the wiring LB both facing each other are formed by patterning using masks different from each other, and the second portion P2 (A) of the wiring LA and the second portion P2 (B) of the wiring LB are also formed by patterning using masks different from each other. Likewise, the third portion P3 (A) of the wiring LA and the third portion P3 (B) of the wiring LB are formed by patterning using masks different from each other.

Thus, according to the wiring group in the second embodiment, it is possible to suppress a fluctuation in the value of the parasitic capacity even when a positional displacement occurs between the first mask used in the first patterning and the second mask used in the second patterning.

Figure 15B:
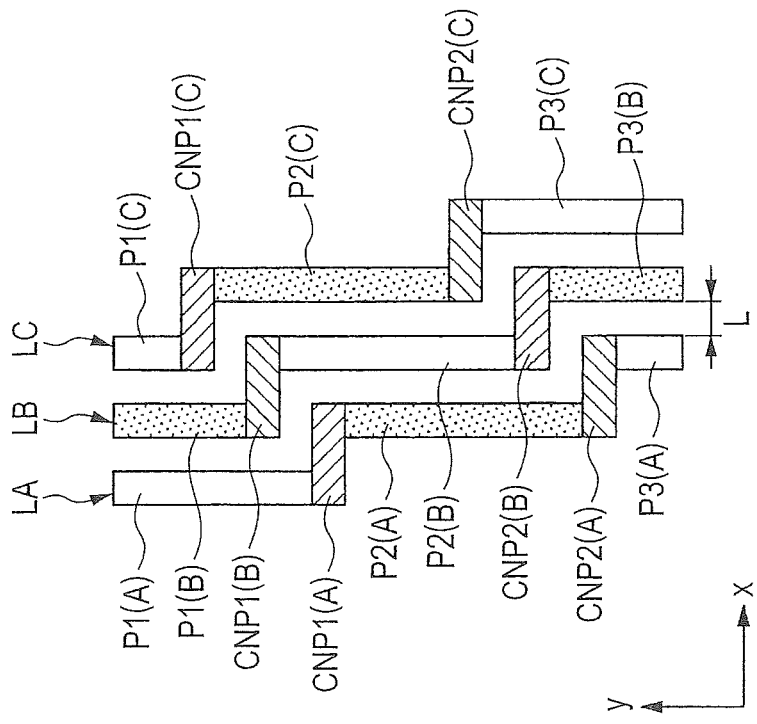
FIG. 15B is a diagram showing an example of a state in which a positional displacement exists between masks.

For example, assume that the position of the first mask used in the first patterning is displaced by "a" in the x direction with respect to the position of the second mask used in the second patterning as shown in FIG. 15B.

When attention is paid to the wirings LA and LB adjacent to each other in this case, as shown in FIG. 15B, the first portion P1 (A) of the wiring LA arranged on the left side is shifted to the right side in the relation between the first portion P1 (A) of the wiring LA and the first portion P1 (B) of the wiring LB. Thus, the distance between the first portion P1 (A) of the wiring LA and the first portion P1 (B) of the wiring LB both facing each other is narrowed to "L−a". As a result, in the relation between the first portion P1 (A) of the wiring LA and the first portion P1 (B) of the wiring LB, a change in the parasitic capacity due to the positional displacement between the masks becomes a change in the direction in which the parasitic capacity becomes larger.

On the other hand, as shown in FIG. 15B, the second portion P2 (B) of the wiring LB arranged on the right side is shifted to the right side in the relation between the second portion P2 (A) of the wiring LA and the second portion P2 (B) of the wiring LB. Thus, the distance between the second portion P2 (A) of the wiring LA and the second portion P2 (B) of the wiring LB both facing each other extends to "L+a". As a result, in the relation between the second portion P2 (A) of the wiring LA and the second portion P2 (B) of the wiring LB, a change in the parasitic capacity due to the positional displacement between the masks becomes a change in the direction in which the parasitic capacity becomes smaller.

Further, as shown in FIG. 15B, the third portion P3 (A) of the wiring LA arranged on the left side is shifted to the right side in the relation between the third portion P3 (A) of the wiring LA and the third portion P3 (B) of the wiring LB, so that the distance between the third portion P3 (A) of the wiring LA and the third portion P3 (B) of the wiring LB both facing each other is narrowed to "L−a". As a result, in the relation between the third portion P3 (A) of the wiring LA and the third portion P3 (B) of the wiring LB, a change in the parasitic capacity due to the positional displacement between the masks becomes a change in the direction in which the parasitic capacity becomes larger.

Thus, when the entire parasitic capacity related to the wirings LA and LB is considered, a change in the entire capacity due to the positional displacement between the masks is canceled and reduced by an increase in the parasitic capacity between the first portion P1 (A) of the wiring LA and the first portion P1 (B) of the wiring LB, a decrease in the parasitic capacity between the second portion P2 (A) of the wiring LA and the second portion P2 (B) of the wiring LB and an increase in the parasitic capacity between the third portion P3 (A) of the wiring LA and the third portion P3 (B) of the wiring LB. As a result, according to the wiring group in the present embodiment, the variation in the parasitic capacity between the wirings LA and LB due to the positional displacement between the masks can be reduced, thereby making it possible to suppress the variation in the characteristics of the semiconductor device. Incidentally, although the present embodiment has been described by paying attention to the wirings LA and LB herein, the relation between the wiring LB and the wiring LC can also be considered in like manner.

Since the variation in the parasitic capacity formed by the wirings LA and LB, and the variation in the parasitic capacity formed by the wirings LB and LC can be reduced as described above, it is possible to form the wiring group which has reduced an influence of the variation in the parasitic capacity due to the positional displacement between the masks according to the second embodiment. Particularly, it is desirable that from the viewpoint of effectively suppressing the variation in the parasitic capacity value, the area of the first patterning and the area of the second patterning are approximately equalized.

Subsequently, a description will be made from the quantitative viewpoint, about the point that the variation in the parasitic capacity due to the positional displacement between the masks can be suppressed as compared with the wiring group in the related art according to the wiring group in the second embodiment shown in FIGS. 15A and 15B.

First, FIG. 15A shows the case where the wirings LA, LB and LC are formed in the state in which no positional displacement occurs between the first mask used in the first patterning and the second mask used in the second patterning in the double patterning method. In this case, the interval between the wirings LA and LB, and the interval between the wirings LB and LC are both equal to each other and respectively become "L", for example. Here, the value of the parasitic capacity between the wirings LB and LC is taken to be "C" by paying attention to the wirings LB and LC.

Next, FIG. 15B is a diagram showing the case where the wirings LA, LB and LC are formed in the state in which the first mask used in the first patterning is positionally displaced by "a" in the x direction with respect to the second mask used in the second patterning. When attention is paid to the wirings LB and LC in FIG. 15B, the first mask is positionally displaced by "a" in the x direction with respect to the second mask, so that the parasitic capacity between the wirings LB and LC in the state in which the positional displacement exists between the masks is approximately represented like an equation (6) shown below:

$$1/2 \cdot C \cdot L/(L-a) + 1/2 \cdot C \cdot L/(L+a) \tag{6}$$

Accordingly, the difference that occurs between the case where the positional displacement exists between the masks and the case where no positional displacement exists therebetween is represented like an equation (7):

$$\text{Difference} = C - \{1/2 \cdot C \cdot L/(L-a) + 1/2 \cdot C \cdot L/(L+a)\} \tag{7}$$

$$= -C \cdot a \cdot a / \{(L+a)(L-a)\}$$

From the above, when the positional displacement exists between the masks in the double patterning method, the value of the parasitic capacity between the wirings LB and LC in the second embodiment is varied by the difference expressed in the equation (7) from "C".

Now consider as the related art, a technique for forming the entire linear-shaped wiring LB and the entire linear-shaped wiring LC by separate masks. In this case, in the related art, assuming that the mask for forming the wiring LB is positionally displaced by "a" in the x direction, the parasitic capacity between the wirings LB and LC in the state in which the positional displacement exists between the masks is represented like an equation (8) shown below:

$$C \cdot L/(L-a) \tag{8}$$

Accordingly, in the related art, the difference that occurs between the case where the positional displacement exists between the masks and the case where no positional displacement exists therebetween is represented like an equation (9):

$$\text{Difference} = C - C \cdot L/(L-a) \tag{9}$$

$$= (-C \cdot a \cdot a - C \cdot L \cdot a)/\{(L+a)(L-a)\}$$

Thus, in the second embodiment as can be seen from the equations (7) and (9), a primary term of "a" is not included in the numerator of the equation (7), but only a secondary term of "a" is included. On the other hand, in the related art, the numerator of the equation (9) includes not only a secondary term of "a" but also a primary term of "a". Here, if "a" is considered to be a minute amount, the secondary term of "a" is reduced to a degree where it becomes negligible smaller than the primary term of "a". Therefore, the parasitic capacity in the second embodiment can be made smaller than the parasitic capacity in the related art.

That is, according to the wiring group in the second embodiment, the variation in the parasitic capacity due to the positional displacement between the masks can be reduced even if the double patterning method is used. In other words, according to the second embodiment, it is possible to suppress the variation in the parasitic capacity of the wiring group due to the mask misalignment and improve operational reliability of the semiconductor device, while maintaining the advantage of double patterning that can cope with microminiaturization exceeding the performance limit of the microfabrication technology using the single mask.

Further, even in the wiring group in the second embodiment, when attention is paid to the wiring LA, for example, the wiring LA is formed from the configuration that as shown in FIGS. 15A and 15B, the first portion P1 (A) and the second portion P2 (A) are coupled by the first coupling portion CNP1 (A), and the second portion P2 (A) and the third portion P3 (A) are coupled by the second coupling portion CNP2 (A).

Thus, according to the second embodiment, it is possible to suppress degradation of the reliability of coupling of the first and second portions due to the positional displacement between the masks at the respective wirings LA to LC by adopting the wiring structure having the above-described first coupling portion CNP1 (A) and second coupling portion CNP2 (A) while maintaining the advantage that the variation in the capacity due to the positional displacement between the masks can be suppressed.

<First Modification>

A description will next be made about a wiring group in a first modification of the second embodiment. The wiring group in the present modification corresponds to a combined configuration of the configuration of the second embodiment and the configuration of the first modification of the first embodiment.

Figure 16:
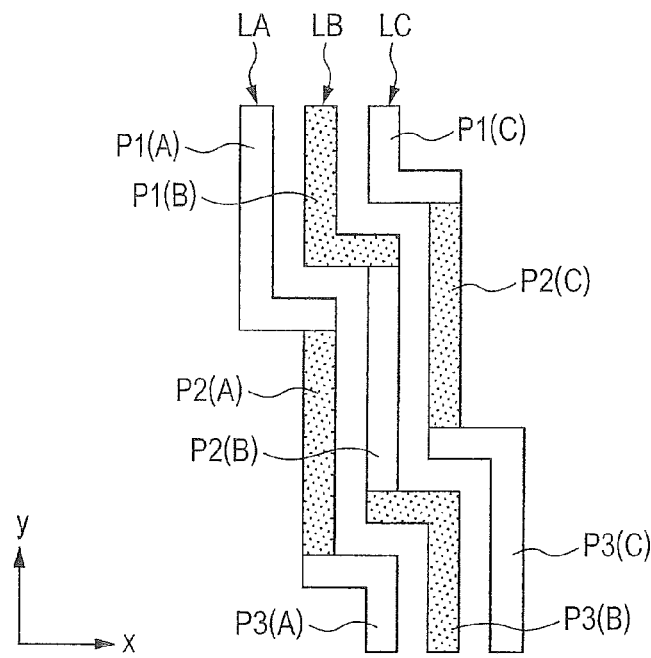
FIG. 16 is a diagram showing a planar configuration of a wiring group in a first modification of the second embodiment.

FIG. 16 is a diagram showing a planar configuration of the wiring group in the present modification. Since the wiring group in the present modification also has a feature point similar to the second embodiment as shown in FIG. 16, the present modification can obtain an advantageous effect similar to the second embodiment. That is, the present modification is also capable of providing the wiring group that suppresses a variation in the parasitic capacity due to the positional displacement between masks and suppressing degradation of the reliability of coupling of the first and second portions and degradation of the reliability of coupling of the second and third portions, which are caused by the positional displacement between the masks.

Further, in the present modification, when attention is paid to a wiring LA, for example, a first coupling portion that couples a first portion P1 (A) and a second portion P2 (A) of the wiring LA is formed integrally with the first portion P1 (A), and a second coupling portion that couples the second portion P2 (A) of the wiring LA and a third portion P3 (A) thereof is formed integrally with the third portion P3 (A). Further, wirings LB and LC are also configured in a manner similar to the wiring LA.

Thus, according to the configuration of the present modification, it is possible to simplify the manufacturing process of the wiring group even while using the double patterning method.

<Second Modification>

Subsequently, a description will be made about a wiring group in a second modification of the second embodiment. The wiring group in the present modification corresponds to a combined configuration of the configuration of the second embodiment and the configuration of the second modification of the first embodiment.

Figure 17:
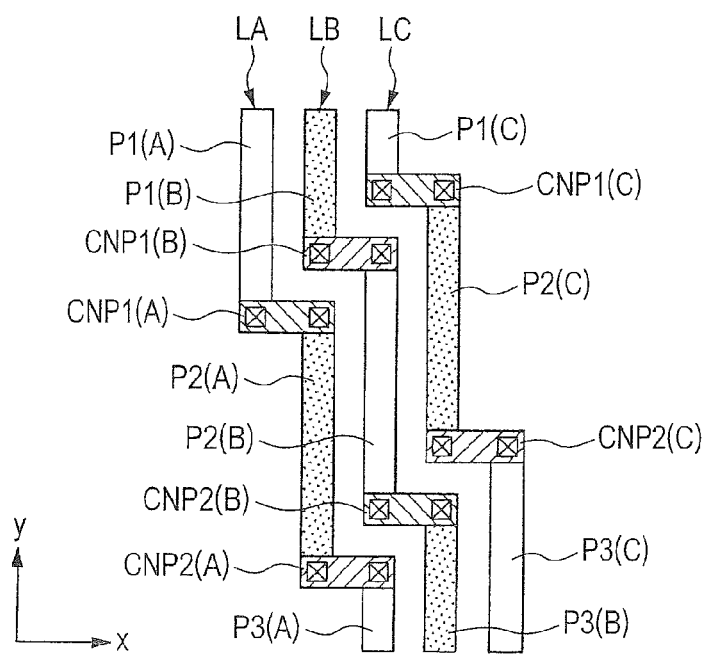
FIG. 17 is a diagram illustrating a planar configuration of a wiring group in a second modification of the second embodiment.

FIG. 17 is a diagram showing a planar configuration of the wiring group in the present modification. Since the wiring group in the present modification also has a feature point similar to the second embodiment as shown in FIG. 17, the present modification is capable of obtaining an advantageous effect similar to the second embodiment. That is, the present modification is also capable of providing the wiring group that suppresses a variation in the parasitic capacity due to the positional displacement between masks and suppressing degradation of the reliability of coupling of the first and second portions and degradation of the reliability of coupling of the second and third portions, which are caused by the positional displacement between the masks.

Further, in the present modification, when attention is paid to a wiring LA, for example, a first coupling portion CNP1 (A) that couples a first portion P1 (A) and a second portion P2 (A) of the wiring LA is formed with a layer different from the first portion P1 (A) and the second portion P2 (A). Further, a second coupling portion CNP2 (A) that couples the second portion P2 (A) of the wiring LA and a third portion P3 (A) thereof is also formed with a layer different from the second portion P2 (A) and the third portion P3 (A). Further, wirings LB and LC are also configured in a manner similar to the wiring LA.

In this case, for example, in the wiring LA, the first coupling portion that couples the first and second portions is formed in a layer above or below the layer formed with the first and second portions. The coupling of the first coupling portion and the first portion, and the coupling of the first coupling portion and the second portion are performed through plugs, for example. Likewise, the second coupling portion that couples the second and third portions is formed in a layer above or below the layer formed with the second and third portions. The coupling of the second coupling portion and the second portion, and the coupling of the second coupling portion and the third portion are performed through plugs, for example.

Although the invention made above by the present inventors has been described specifically on the basis of the embodiments, the present invention is not limited to the embodiments referred to above. It is needless to say that various changes can be made thereto within the scope not departing from the gist thereof.

What is claimed is:

1. A method for manufacturing a semiconductor device, the method comprising:
   (a) forming a first conductor pattern and a second conductor pattern running side by side with each other, the
      (a) forming including:
      (a1) forming a first portion of the first conductor pattern and a second portion of the second conductor pattern by patterning using a first mask; and
      (a2) forming a second portion of the first conductor pattern and a first portion of the second conductor pattern by patterning using a second mask,
   wherein a first inter-conductor capacity is formed by the first portion of the first conductor pattern and the first portion of the second conductor pattern, and
   wherein a second inter-conductor capacity is formed by the second portion of the first conductor pattern and the second portion of the second conductor pattern.

2. The method according to claim 1, wherein, when a positional displacement occurs between the first mask and the second mask, the first inter-conductor capacity becomes larger than when the positional displacement does not occur between the first mask and the second mask, whereas the second inter-conductor capacity becomes smaller than when the positional displacement does not occur between the first mask and the second mask.

3. The method according to claim 1, wherein, when the positional displacement occurs between the first mask and the second mask, the first inter-conductor capacity becomes smaller than when the positional displacement does not occur between the first mask and the second mask, whereas the second inter-conductor capacity becomes larger than when the positional displacement does not occur between the first mask and the second mask.

4. The method according to claim 1, wherein an area of the first portion of the first conductor pattern formed in the (a1) forming, and an area of the second portion of the first conductor pattern formed in the (a2) forming are equal to each other.

5. The method according to claim 1, wherein an area of the second portion of the second conductor pattern formed in the (a1) forming, and an area of the first portion of the second conductor pattern formed in the (a2) are equal to each other.

6. The method according to claim 1, wherein the first conductor pattern comprises a first electrode of a capacitive element, and
wherein the second conductor pattern comprises a second electrode of the capacitive element.

7. The method according to claim 1, wherein the first conductor pattern comprises a first wiring,
wherein the second conductor pattern comprises a second wiring, and
wherein the first inter-conductor capacity and the second inter-conductor capacity comprise respectively a parasitic capacity generated between the first wiring and the second wiring.

8. The method according to claim 1, wherein the running side by side with each other includes that the first conductor pattern and the second conductor pattern extend while maintaining the distance between the first conductor pattern and the second conductor pattern at a prescribed distance irrespectively of the shapes of the first and second conductor patterns.

9. A method for manufacturing a semiconductor device, the method comprising:
forming a first conductor pattern and a second conductor pattern by a combination of a first patterning using a first mask and a second pattering using a second mask,
wherein, when a positional displacement occurs between the first mask and the second mask, each of the first conductor pattern and the second conductor pattern is divided into a portion formed by the first patterning and a portion formed by the second patterning in such a manner that a portion where a distance between the first conductor pattern and the second conductor pattern becomes smaller than when the positional displacement does not occur between the first and second masks and a portion where a distance becomes larger than when the positional displacement does not occur between the first and second masks exist.

10. The method according to claim 9, wherein, when the positional displacement occurs between the first mask and the second mask, a portion where a capacity between the first conductor pattern and the second conductor pattern becomes smaller than when the positional displacement does not occur between the first mask and the second mask, and a portion where the capacity becomes larger than when the positional displacement does not occur between the first mask and the second mask exist.

11. The method according to claim 9, wherein the first conductor pattern comprises a first electrode of a capacitive element, and
wherein the second conductor pattern comprises a second electrode of the capacitive element.

12. The method according to claim 9, wherein the first conductor pattern comprises a first wiring, and
wherein the second conductor pattern comprises a second wiring.

* * * * *